(12) United States Patent
Nguyen

(10) Patent No.: US 6,501,312 B1
(45) Date of Patent: Dec. 31, 2002

(54) FAST-LOCKING DLL CIRCUIT AND METHOD WITH PHASED OUTPUT CLOCK

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/122,595

(22) Filed: Apr. 15, 2002

Related U.S. Application Data

(63) Continuation-in-part of application No. 09/755,671, filed on Jan. 5, 2001, now Pat. No. 6,373,308, which is a continuation-in-part of application No. 09/493,858, filed on Jan. 28, 2000, now Pat. No. 6,255,880, which is a continuation-in-part of application No. 09/427,143, filed on Oct. 25, 1999, now Pat. No. 6,285,226.

(51) Int. Cl.[7] .................................................. H03L 7/00
(52) U.S. Cl. ........................ 327/161; 327/158; 327/159; 327/276; 375/376; 331/DIG. 2
(58) Field of Search ................................. 327/261, 269, 327/271, 276, 277, 284, 291, 144, 146, 152, 153, 155, 161; 375/371, 373, 376, 362; 365/233, 233.5; 331/DIG. 2, 1 A

(56) References Cited

U.S. PATENT DOCUMENTS

| | | | | |
|---|---|---|---|---|
| 5,049,766 A | * | 9/1991 | van Driest et al. ........... 327/19 |
| 5,245,637 A | | 9/1993 | Gersbach et al. ........... 375/374 |
| 5,329,188 A | | 7/1994 | Sikkink et al. ............... 327/18 |
| 5,451,894 A | * | 9/1995 | Guo ............................ 327/237 |
| 5,537,069 A | | 7/1996 | Volk ............................ 327/149 |
| 5,994,938 A | | 11/1999 | Lesmeister .................. 327/277 |
| 6,040,726 A | | 3/2000 | Martin ........................ 327/175 |
| 6,100,735 A | | 8/2000 | Lu ............................... 327/158 |
| 6,232,812 B1 | * | 5/2001 | Lee ............................. 327/161 |

OTHER PUBLICATIONS

Xilinx Application Note, "Using the Virtex Delay–Locked Loop", XAPP132, Oct. 21, 1998 (Version 1.31).

* cited by examiner

Primary Examiner—Minh Nguyen
(74) Attorney, Agent, or Firm—Lois D. Cartier

(57) ABSTRACT

A delay-lock loop (DLL) circuit and method that accept an input clock signal and a feedback clock signal, and provide the necessary additional delay to synchronize the feedback clock signal to the input clock signal. In a first mode, the DLL circuit counts and stores a first number of delays necessary to synchronize the two signals. In some embodiments, the circuit also stores a second value representing the number of unit delays in one clock period. In a second mode, the DLL circuit uses the first stored value to add the correct number of unit delays to the input clock signal. In some embodiments, the second stored value is used to generate phased output signals.

14 Claims, 12 Drawing Sheets

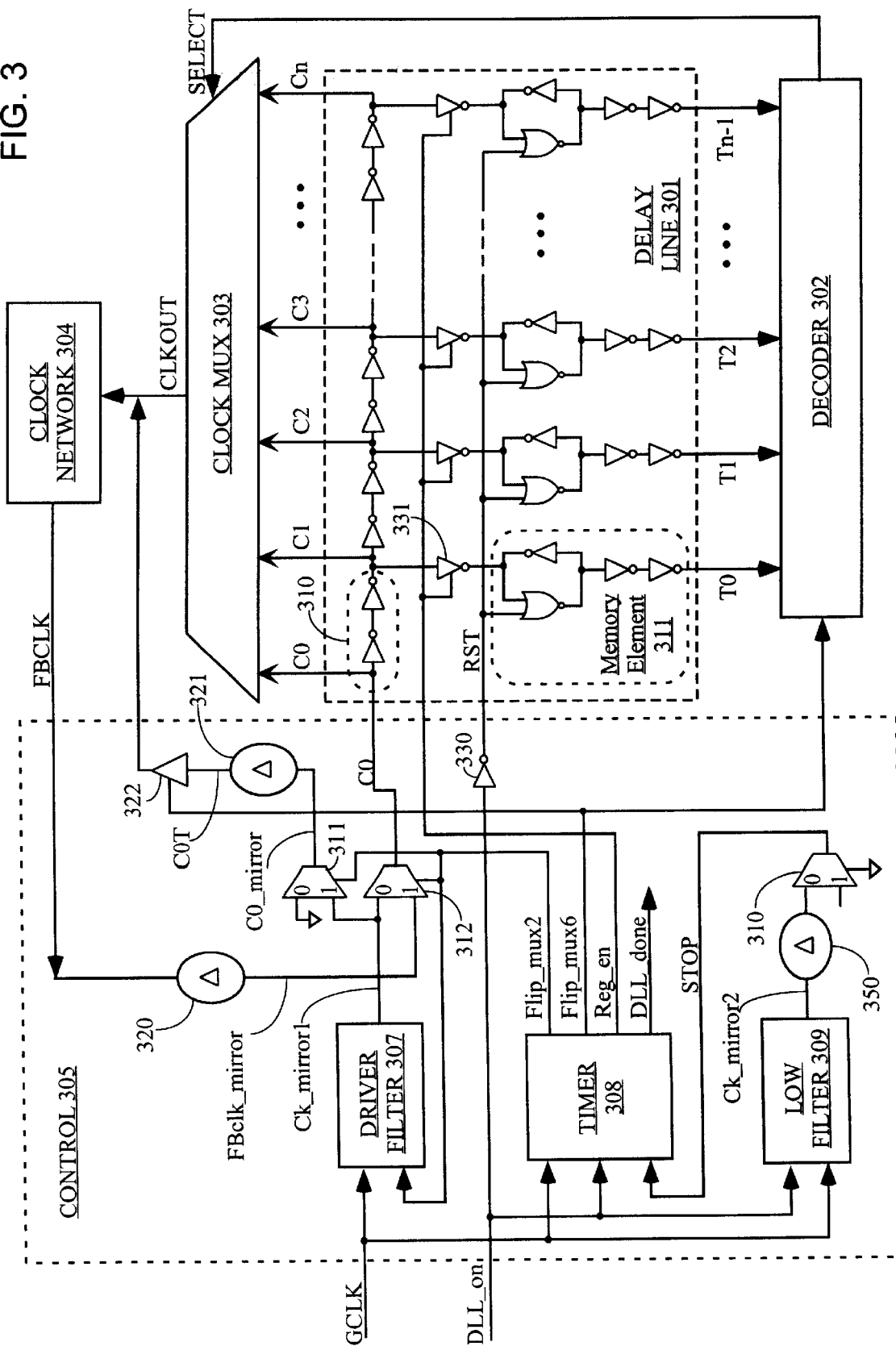

FAST-LOCKING DLL CIRCUIT AND METHOD WITH PHASED OUTPUT CLOCK

FIELD OF THE INVENTION

The invention relates to delay-lock loops (DLLs). More particularly, the invention relates to a DLL circuit and method for an integrated circuit (IC).

BACKGROUND OF THE INVENTION

Clock signals are used in virtually every IC and electronic system to control timing. For example, every time there is a rising edge on a clock signal, all the flip-flops in a circuit may change state. Clearly, clocks are often heavily loaded signals, and may be bussed throughout a very large IC. Even with specially-designed global buffers, there is typically a delay between the clock edge received by the IC at the pad, and the clock edge received by the last-served flip-flop on the IC (i.e., between the "input clock signal" and the "destination clock signal"). This delay, designated herein as $t_d$, may cause difficulties in interfacing between ICs, or simply slow down the overall system speed. Input data may be provided in synchronization with the input clock signal, while output data is typically provided in synchronization with the destination clock signal. Further, $t_d$ often varies not only between different ICs, but on a single IC with temperature and voltage as well. It is highly desirable to have a circuit and method for synchronizing a destination clock signal with an input clock signal, so that the destination clock signals of various ICs can be commonly synchronized by synchronizing each destination clock signal to a common input clock signal.

This clock synchronization procedure is often performed using a phase-lock loop (PLL) or delay-lock loop (DLL). However, known PLLs and DLLs consume a great deal of silicon area. Additionally, PLLs are often analog in nature and take an extremely long time to simulate, and a design that works in one manufacturing process may stop working when manufactured using another process. Further, analog PLLs can be particularly sensitive to radiation. Therefore, PLLs are very difficult to design, and often are not feasible in a given circuit or system.

Known DLLs are also very complicated and difficult to design. Further, known DLLs require many input clock cycles to "lock", i.e., to synchronize a destination clock signal to an input clock signal. As described below, known DLLs also typically run continuously during the entire time the two clock signals must be synchronized, frequently adjusting the destination clock signal to keep it properly synchronized. This constant adjustment not only requires a large and complicated state machine, it also injects a lot of noise into the clock network. Because a noisy clock signal can cause enormous problems in a sensitive IC circuit, a large stabilizing capacitor is often required between the positive power supply (VDD) and the zero voltage level (ground). For one or more of these reasons, clock synchronization is often not feasible using known circuits and methods.

Therefore, it is desirable to provide a delay-lock loop circuit and method using a fairly simple circuit that consumes a relatively small amount of silicon area and locks in a few clock cycles.

Additionally, it is desirable to provide a phased output clock signal, i.e., a series of output clock signals that become active sequentially in a repeating sequence. For example, when four phased output clock signals are provided, each output clock signal can be used to clock only one-fourth of a large circuit at any given time, thus reducing the maximum current flow in the circuit. Phased clocks are also easier to use in circuits that require pre-charge and evaluation clock phases.

SUMMARY OF THE INVENTION

The invention provides a delay-lock loop (DLL) circuit and method that accept an input clock signal and a feedback clock signal, and provide the necessary additional delay to synchronize the feedback clock signal to the input clock signal. A single synchronization step is sufficient, provided that the frequency of the input clock signal is stable. Further, only one delay line is required to implement the DLL circuit. Therefore, the DLL of the present invention is both quick to "lock in" a clock signal and efficient in the use of hardware resources. Further, the present DLL is very accurate, because the same delay line is used to calculate the necessary additional delay and to generate the output clock signal.

A circuit according to the invention includes an input clock terminal supplying an input clock signal, a feedback clock terminal supplying a feedback clock signal, a delay line, and a control circuit controlling access from the input clock terminal and the feedback clock terminal to the delay line. The DLL has two modes. In the first (or "counting") mode, the delay line supplies to a decoder circuit a first plurality of intermediate clock signals delayed from the feedback clock signal by incremental unit delays. In the second ("or operating") mode, the value provided to the decoder circuit in the first mode is latched, while the delay line supplies to a clock multiplexer a second plurality of intermediate clock signals delayed from the input clock signal by incremental unit delays.

The clock multiplexer uses the latched decoder circuit value to select from among the second intermediate clock signals the clock signal that provides the necessary additional delay to.synchronize the feedback clock signal to the input clock signal, i.e., the clock signal subject to a delay about equal to (e.g., closest to but not exceeding) the delay needed to bring a first (e.g., rising) edge of the feedback clock signal into synchronization with the same (e.g., rising) edge of the input clock signal. The output clock signal from the clock multiplexer is distributed through the clock network to provide the distributed clock signal as well as the feedback clock signal. (In another embodiment, the intermediate clock signal selected by the clock multiplexer is the intermediate clock signal subject to a delay closest to and exceeding the delay needed to synchronize the feedback and input clock signals.)

The decoder circuit essentially counts the number of unit delays between a first (e.g., rising) edge of the feedback clock signal and the same (e.g., rising) edge of the input clock signal. This delay period is the additional delay that must be added by the DLL to bring the two clocks into synchronization. This number is then used to select the correct intermediate clock signal.

An advantage of the invention is that once the two clocks are synchronized, they need not be resynchronized unless the frequency of the input clock signal changes. Although the feedback clock signal may not be exactly synchronized to the input clock signal (the degree of accuracy depending on the granularity of the unit delay compared to the measured delay), the offset between the two clock signals does not change with time, and no subsequent adjustments need be made, as with prior art DLL circuits. Therefore, the circuit and method of the invention inject significantly less noise into the IC than known methods. Further, this "one-shot" capability (i.e., the ability to synchronize the two clocks in a single synchronization step) means that the circuit of the invention is much easier to simulate, and thus to design, than known DLL circuits.

Another advantage of the invention is that the circuit is smaller and therefore less expensive to implement than known DLL circuits, because no large state machine is required. Therefore, using the DLL circuit of the invention, clock synchronization capability can be added to smaller and less expensive ICs than was previously feasible. Further, only one delay line is required to implement the circuit, thereby both.reducing the size of the circuit and ensuring exact matching of unit delays between the "counting" phase (the first mode) and the "operating" phase (the second mode).

Other embodiments of the invention provide phased output clock signals. In these embodiments, in the "counting" mode, in addition to counting the number of unit delays necessary to synchronize the clocks, the circuit also counts the number of incremental unit delays between a first (e.g., rising) edge of the feedback clock signal and the next same (e.g., rising) edge of the feedback clock signal. The resulting number is the number of incremental unit delays in a single feedback clock period, which is also the number of incremental unit delays in a single input clock period. This number is divided by a number of desired output clock phases (e.g., four), and the result is used to generate the phased clock signals.

One such embodiment includes a latch circuit, a second decoder circuit, and a phase generator circuit. The delay line supplies to the latch circuit the first plurality of intermediate clock signals delayed from the feedback clock signal by incremental unit delays. The latch circuit counts and stores a value representing the number of incremental unit delays in a single feedback clock period. The second decoder circuit decodes the stored value and provides to the phase generator circuit a plurality of phase select signals that control the number of unit delays between each phased output clock.

BRIEF DESCRIPTION OF THE DRAWINGS

The present invention is illustrated by way of example, and not by way of limitation, in the following figures, in which like reference numerals refer to similar elements.

FIG. 3 is a block diagram of one embodiment of the invention.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Clock Network Delay

Figure 1A:
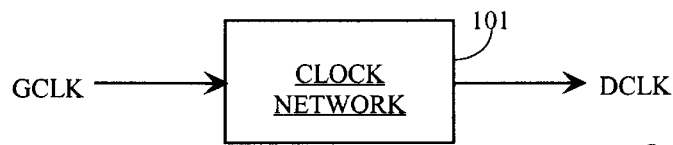
FIG. 1A is a simple block diagram of a global clock network, showing the input and output signals.
Figure 1B:
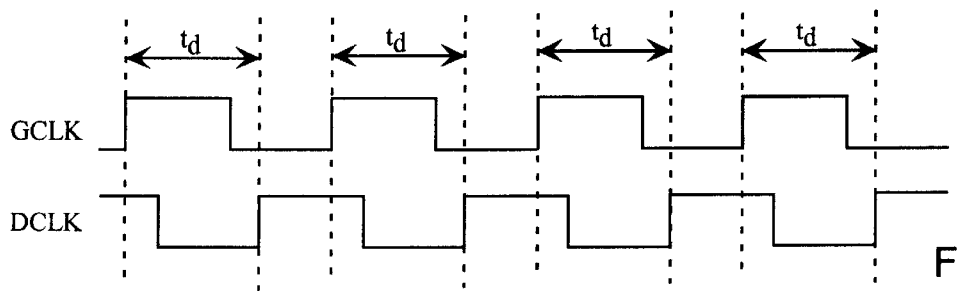
FIG. 1B is a timing diagram showing the interrelationship between the input and output signals of the global clock network of FIG. 1A.

FIG. 1A is a simple block diagram of a clock network 101 having an intrinsic delay, the diagram showing the input clock terminal GCLK and the output clock terminal DCLK. FIG. 1B shows the corresponding signals. (In the present specification, the same reference characters are used to refer to terminals, signal lines, and their corresponding signals.) As shown in FIG. 1B, the output clock signal DCLK has a frequency the same as that of the input clock signal GCLK, but delayed by a time $t_d$.

Note that FIG. 1B shows the rising edge of the DCLK signal occurring within the second half of the input clock period. Alternatively, the rising edge of the DCLK signal may occur during the first half of the input clock period, or the clock network delay may be longer than the input clock period, such that the rising edge of the DCLK signal occurs in either half of a subsequent input clock period, or simultaneously with a GCLK edge. The case where the rising edge of the DCLK signal occurs in the second half of the same input clock period is depicted herein in each of the figures, for consistency. It is understood that the other examples mentioned may be extrapolated from the pictured examples.

Prior Art DLLs

Figure 2A:
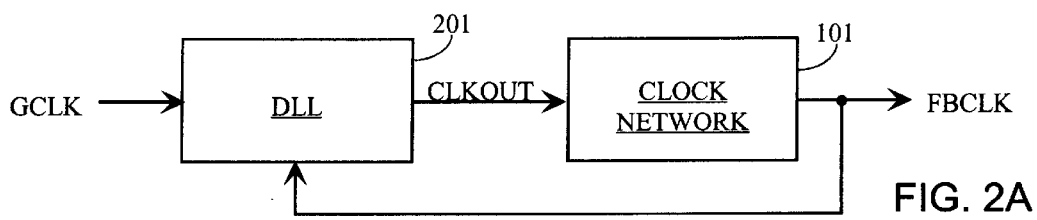
FIG. 2A is a simple block diagram showing how a DLL circuit is used to synchronize two clock signals, showing the input and output signals.
Figure 2B:
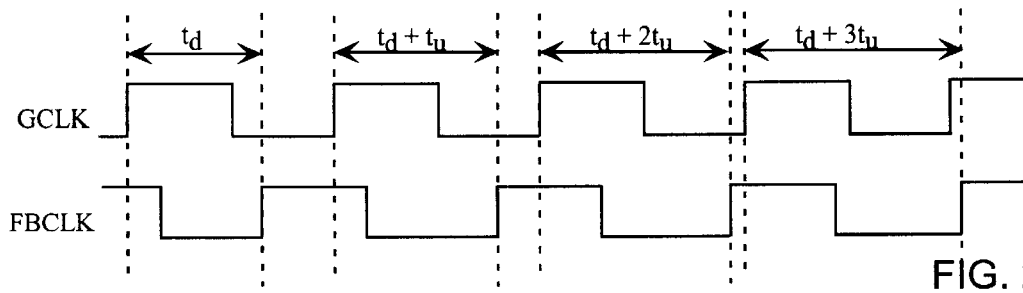
FIG. 2B is a timing diagram showing the interrelationships among the input and output signals when a prior art circuit and method are used to implement the DLL circuit of FIG. 2A.

FIG. 2A is a simple block diagram of a DLL circuit 201 and a clock network 101, the DLL being driven by both the input clock signal GCLK and the feedback clock FBCLK provided by the clock network 101. FIG. 2B shows the corresponding signals for a prior art DLL. (Note that FIG. 2B has been simplified as described below, for clarity.)

During the first input clock cycle shown, feedback clock signal FBCLK is delayed from input clock signal GCLK by a time $t_d$. During the second input clock cycle shown, feedback clock signal FBCLK has been altered, such that it is delayed from input clock signal GCLK by a time $t_d$ plus a single unit delay $t_u$. During the third input clock cycle shown, feedback clock signal FBCLK has been delayed from input clock signal GCLK by a time $t_d$ plus two unit delays, or $2t_u$. During the fourth input clock cycle shown, feedback clock signal FBCLK has been delayed from input clock signal GCLK by a time $t_d+3t_u$. Because the DLL circuit has "overshot its target", in a fifth input clock cycle (not shown) the delay on feedback clock signal FBCLK will be reduced to $t_d+2t_u$, then returned to $t_d+3t_u$, back to $t_d+2t_u$, and so forth in a continual adjustment process.

This adjustment process actually takes much longer than is shown in FIG. 2B. A typical DLL takes sufficiently long to determine the appropriate adjustment that many "extra" clock cycles are inserted between each adjustment. For example, it may take six clock cycles to perform an adjustment. Thus, only one unit delay can be added or subtracted for each six clock cycles. These extra clock periods have been omitted from FIG. 2B, for clarity.

Clearly, obtaining the correct adjustment for a feedback clock can be a time-consuming (or even perpetual) process, using known methods.

DLLs According to the Invention

Figure 2C:
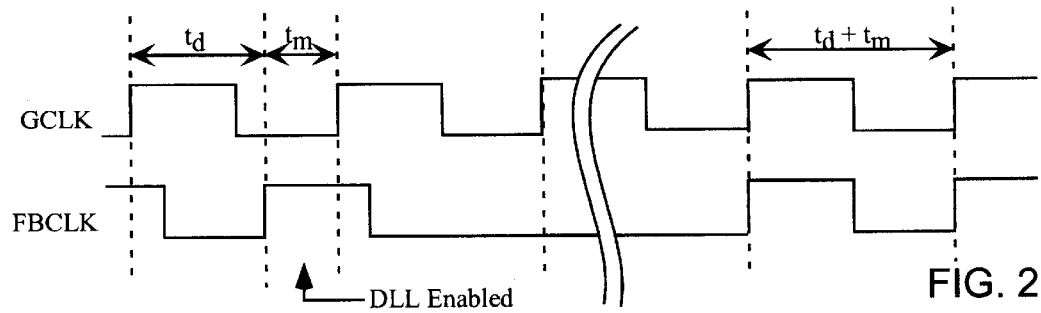
FIG. 2C is a timing diagram showing the interrelationships among the input and output signals when the circuit and method of the invention are used to implement the DLL circuit of FIG. 2A.

FIG. 2C shows the same signals as in FIG. 2B, but for a DLL implemented according to the circuit and method of the invention. During the first input clock cycle shown, feedback clock signal FBCLK is delayed from input clock signal GCLK by a time $t_d$. During this clock cycle, the DLL is disabled. When the DLL is enabled (for example, at the time indicated by an arrow in FIG. 2C), the DLL output clock signal CLKOUT completes its current clock cycle, then is temporarily held to an inactive state (e.g., low), and the feedback clock signal FBCLK ceases to oscillate. After a predetermined number of clock cycles (e.g., 10), the CLKOUT and FBCLK signals once more begin to oscillate, with the clock edges of the feedback clock signal now being adjusted to match the clock edges of the input clock signal.

For example, in the timing diagram of FIG. 2C, $t_m$ is the number of unit delays that need to be added to the feedback clock signal FBCLK to synchronize the feedback clock with the global clock GCLK. (If the clocks are the same as in FIG. 2B, then $t_m=2t_u$.) During the final input clock cycle shown, feedback clock signal FBCLK has been altered, such that it is delayed from input clock signal GCLK by a time $t_d+t_m$. During subsequent input clock cycles, feedback clock signal FBCLK does not alter; it has been "locked". No continual adjustment process is needed.

Figure 4:
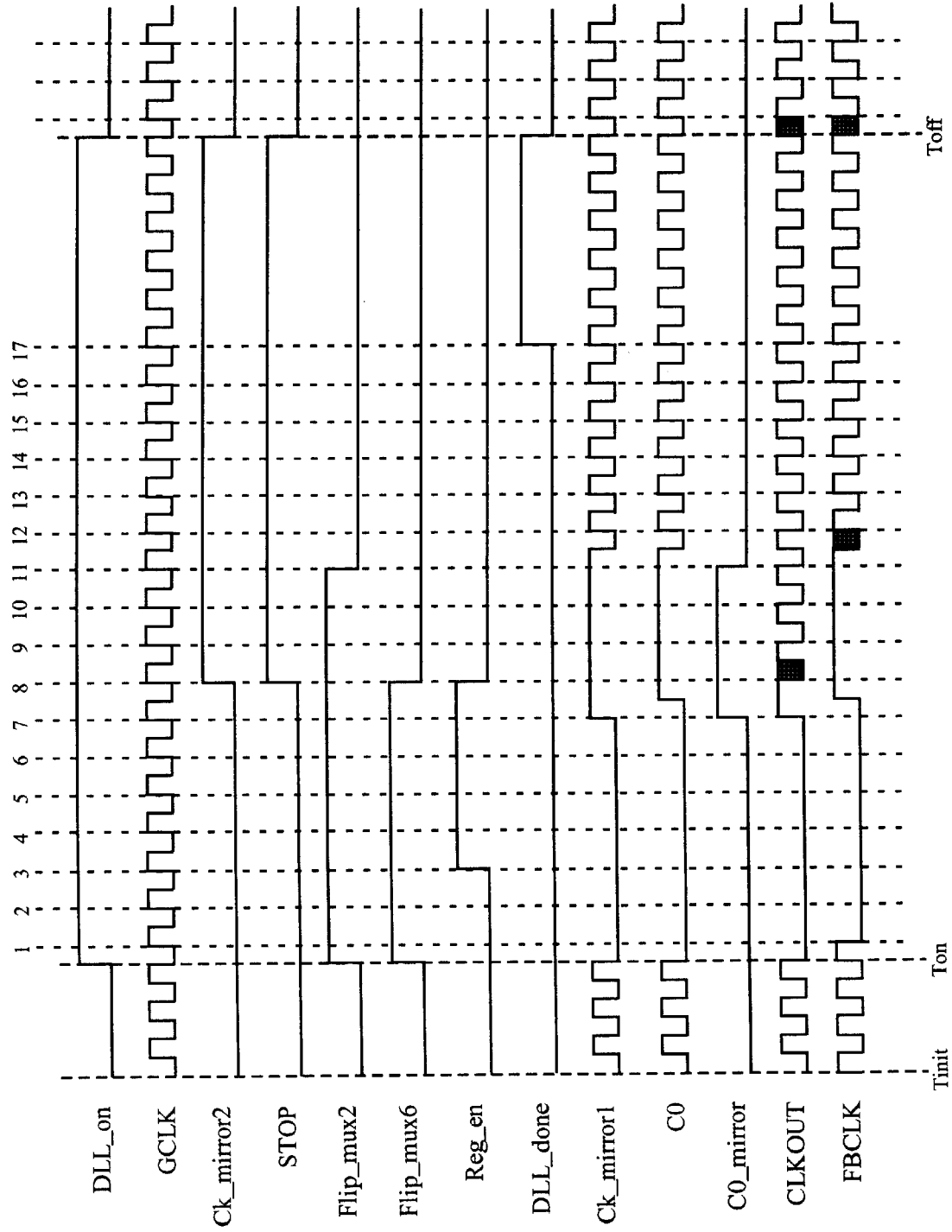
FIG. 4 is a timing diagram illustrating the functionality of the embodiment of FIG. 3.

A more detailed timing diagram is provided in FIG. 4, and is described in conjunction with the embodiment of FIG. 3.

First Detailed Embodiment

FIG. 3 shows a block diagram of a DLL circuit according to one embodiment of the invention. The DLL circuit of FIG. 3 includes a delay line 301, a decoder circuit 302, a clock multiplexer 303, a clock network 304 (generally located external to the DLL, but included in FIG. 3 for clarity), and a control circuit 305.

Clock network 304 provides a feedback clock signal FBCLK that drives both control circuit 305 and other circuits in the IC.

Delay line 301 is driven by control circuit 305, which provides to the delay line a signal C0 derived either from feedback clock signal FBCLK (in a first mode) or from input clock signal GCLK (in a second mode). Delay line 301 comprises a series of delay elements 310, each having a delay of one "unit delay". A unit delay can be any period of time appropriate to the application of the DLL circuit. For example, a unit delay can be measured in tens, hundreds, or thousands of picoseconds, or even longer periods of time, particularly for non-IC applications. Delay line 301 provides a plurality of intermediate clock signals, respectively delayed by 0, 1, ..., n unit delays from the signal C0. Thus, delay line 301 provides from signal C0 a first plurality of intermediate clock signals (T0, T1, Tn-1) to decoder circuit 302, and a second plurality of intermediate clock signals (C0, C1, ..., Cn) to clock multiplexer 303.

In the pictured embodiment, the first plurality of intermediate clock signals are stored (e.g., latched) in a series of memory elements 311.

Decoder circuit 302 uses the stored first intermediate clock signals to "count" the number of unit delays between a rising edge of the feedback clock signal FBCLK and the following rising edge of the input clock signal GCLK. Decoder circuit 302 then uses this counted number of unit delays to control the clock multiplexer. For example, referring to FIG. 2C, decoder circuit 302 determines the number of unit delays in time interval $t_m$. Clock multiplexer 303 selects one of the second intermediate clock signals derived from input clock signal GCLK and provides the selected signal as signal CLKOUT to clock network 304.

Clock multiplexer 303 (under control of decoder circuit 302) selects the intermediate clock signal subject to the necessary additional delay to synchronize feedback clock signal FBCLK to input clock signal GCLK, i.e., the intermediate clock signal subject to a delay closest to but not exceeding the delay needed to bring a first (e.g., rising) edge of the feedback clock signal into synchronization with the same (e.g., rising) edge of the input clock signal. This counting and selection process is controlled by control circuit 305.

FIG. 3 pictures one embodiment of control circuit 305. However, it will be clear to those of ordinary skill in the art that the DLL of the invention can be implemented using other control circuits. Provided that the control circuit functions substantially as described above, the implementation of control circuit 305 can vary, and such variations fall within the scope of the present invention.

In the embodiment of FIG. 3, control circuit 305 includes driver filter 307, timer circuit 308, low filter 309, multiplexers 310–312, delay matching circuits 320–321, tristate buffer 322, and inverter 330.

Delay matching element 350 and multiplexer 310 are provided between the CK_mirror2 signal and the STOP signal to match the loading between signals CK_mirror2 and CK_mirror1. Delay matching circuit 320 is provided between signals FBCLK and FBclk_mirror to match the delay and loading between signals FBclk_mirror and CK_mirror1. Delay matching circuit 321 is provided between signals C0_mirror and C0T to match the delay and loading between signals C0_mirror and C0. In other embodiments, other delay matching techniques can be used to match the signal characteristics of the three signals FBclk_mirror, CK_mirror1, and CK_mirror2, and to match the signal characteristics of the two signals C0 and C0_mirror.

Figure 5:
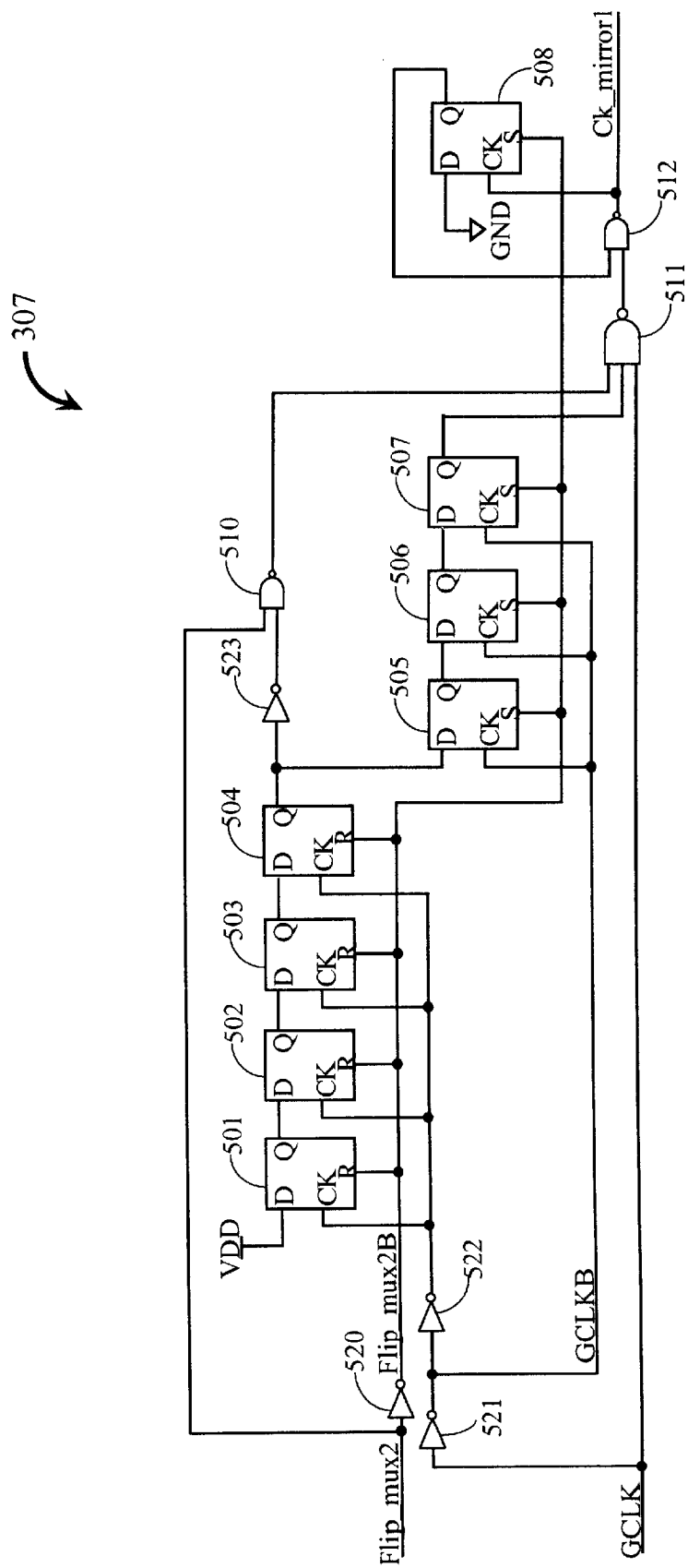
FIG. 5 is a block diagram of a driver filter circuit that can be used with the embodiment of FIG. 3.

Driver filter 307 behaves as follows. If signal Flip_mux2 is low, then the output (CK_mirror1) of the driver filter echoes the input signal (GCLK). If signal Flip_mux2 is high, then after a first predetermined number of clock cycles, the output (CK_mirror1) of the driver filter goes from low to high, then stays high. Therefore, driver filter 307 behaves either as a driver circuit (if Flip_mux2 is low), or as a 1-edge filter with a delay of N clock cycles (if Flip_mux2 is high). One implementation of driver filter 307 is shown in FIG. 5 and is described below with reference to that figure.

Figure 6:
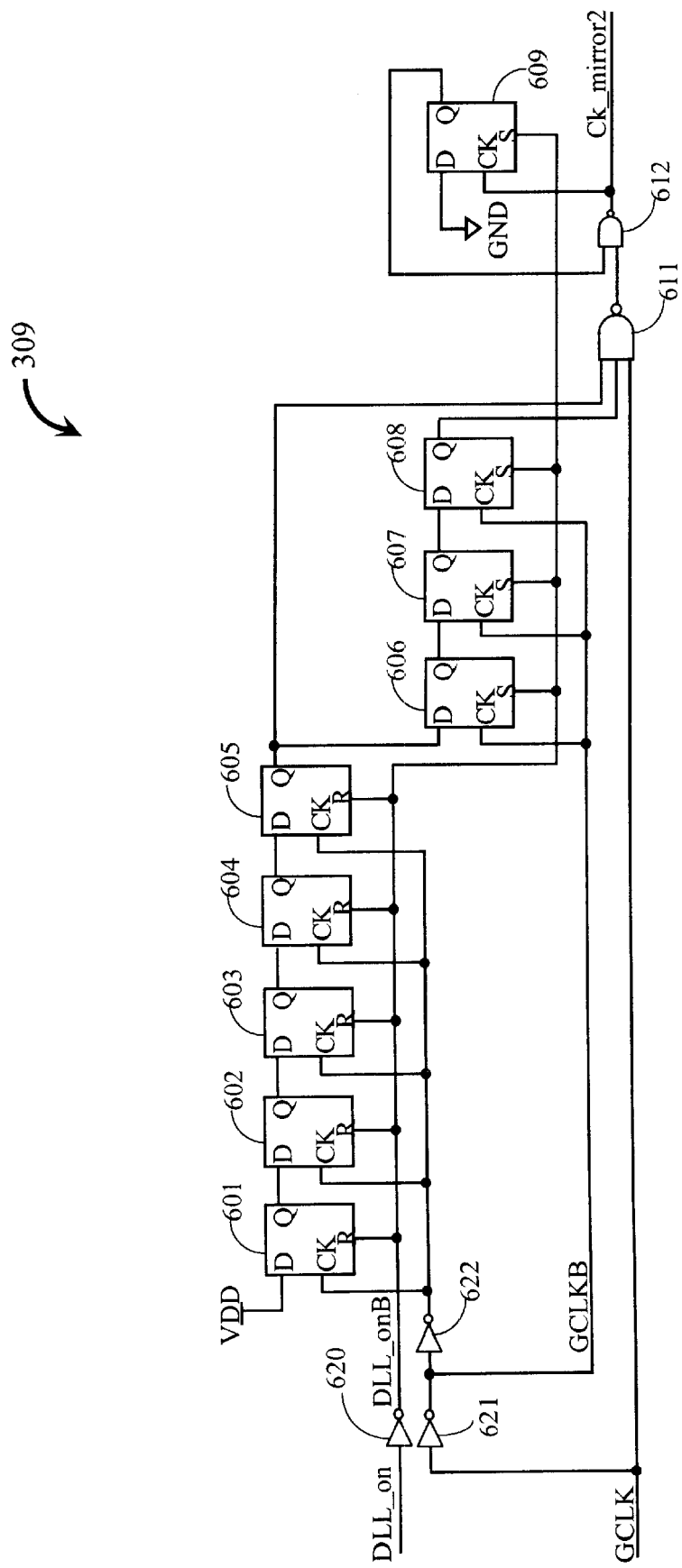
FIG. 6 is a block diagram of a low filter circuit that can be used with the embodiment of FIG. 3.

Low filter 309 behaves as follows. If signal DLL_on is low, then the output (CK_mirror2) of the driver filter is low. If signal DLL_on is high, then after a second predetermined number of clock cycles that is one more than the first predetermined number of clock cycles, the output (CK_mirror2) of the driver filter 309 goes from low to high, then stays high. Therefore, low filter behaves either as connection to ground (if DLL_on is low), or as a 1-edge filter with a delay of N+1 clock cycles (if DLL_on is high). One implementation of low filter 309 is shown in FIG. 6 and is described below with reference to that figure.

Figure 7:
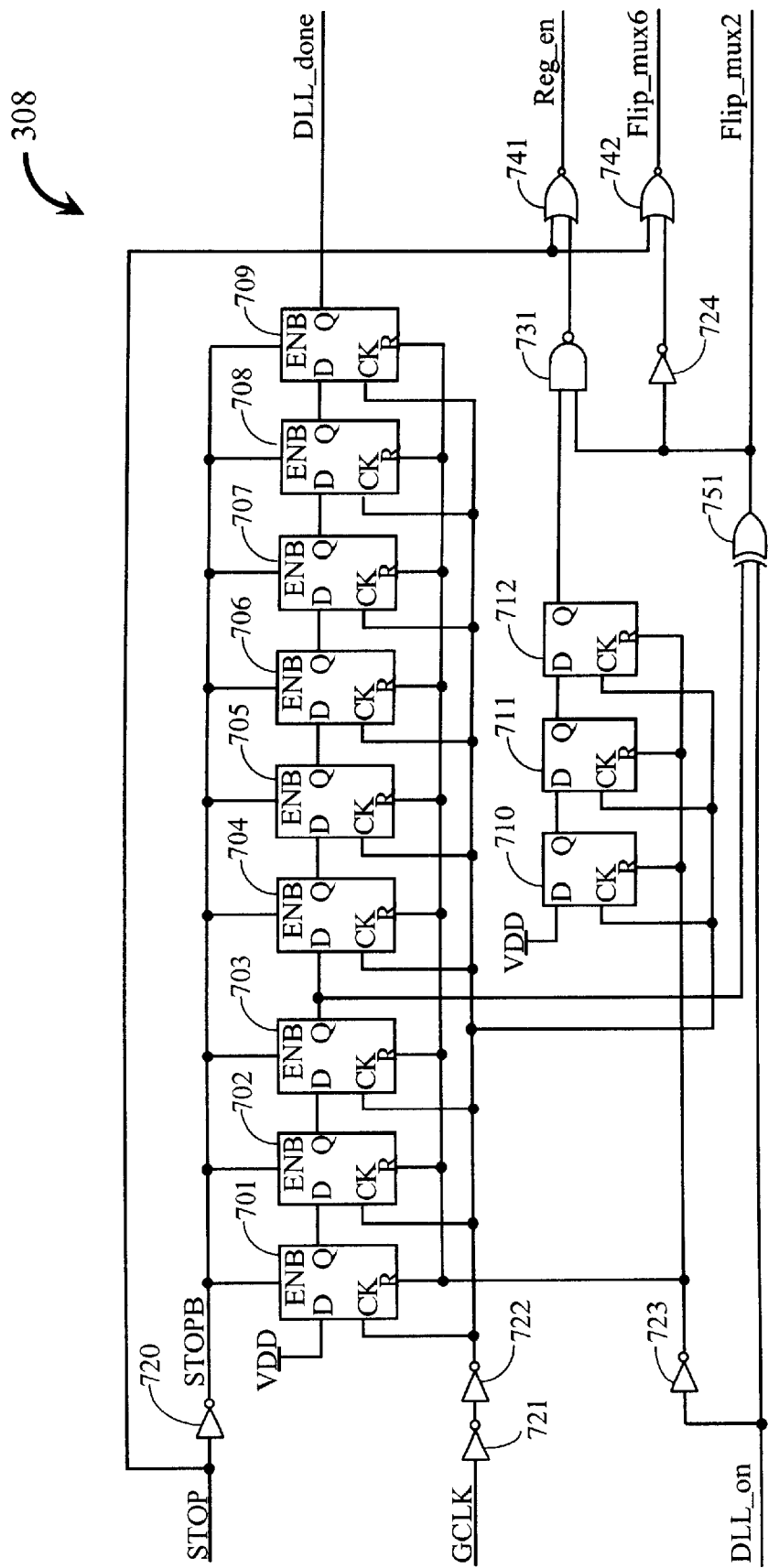
FIG. 7 is a block diagram of a timer circuit that can be used with the embodiment of FIG. 3.

Timer circuit 308 is a state machine that generates control signals Flip_mux2, Flip_mux6, Reg_en, and DLL_done in a predetermined sequence and with predetermined timing. One implementation of timer circuit 308 is shown in FIG. 7 and is described below with reference to that figure. The predetermined sequence and predetermined timing of control signals Flip_mux2, Flip_mux6, Reg_en, and DLL_done are shown in FIG. 4.

Signals Reg_en and DLL_on (inverted by inverter 330) control delay line 301 as follows. If DLL_on is low, then the reset signal RST is high, and the outputs of all memory elements 311 (T0, T1, . . . , Tn−1) are low. If DLL_on is high, then the reset signal RST is low, and the memory elements function as latches. If Reg_en is high, then inverting tristate buffers 331 are active (i.e., driving), and the latches hold the current signals (C1, C2, . . . , Cn) from the delay elements 310; i.e., the latches can receive new data. If Reg_en is low, then tristate buffers 331 are tristated, and the previous signals from the delay elements 310 are latched.

Signal Flip_mux6 controls decoder circuit 302 as follows. If Flip_mux6 is high, decoder circuit 302 generates output signals (SELECT) that tristate the clock multiplexer 303. If Flip_mux6 is low, the decoder circuit generates output signals (SELECT) that enable clock multiplexer 303 to select the appropriate intermediate clock signal. For example, if all of signals T0, T1, . . . , Tn−1 are low, then clock multiplexer 303 selects the C0 intermediate clock signal. If T<0:n−1>is 1110000000 . . . 0, then intermediate clock signal C3 is selected because there are three high signals. The decoder circuit follows this pattern, thereby essentially "counting" the number of high signals in latched clock signals T0, T1, . . . , Tn−1 and using this number to select the appropriate clock signal.

Timing Diagram

The functionality of the DLL circuit of FIG. 3 is now described with reference to the timing diagram of FIG. 4.

Initially, at time Tinit, the DLL is disabled, i.e., signal DLL_on is low. DLL control signals Flip_mux2, Flip_mux6, Reg_en, and DLL_done are all low, as are signals CK_mirror2, STOP, and T<0:n−1>. Therefore, the DLL input clock signal GCLK is routed through driver filter 307 to signal CK_mirror1, which therefore follows signal GCLK, as shown in FIG. 4. Signal CK_mirror1 is selected by multiplexer 312 (because control signal Flip_mux2 is low) and is provided to delay line 301 as signal C0.

Because control signal Flip_mux6 is low, decoder circuit 302 provides SELECT control signals that enable clock multiplexer 303 to select the C0 intermediate clock signal, as described above. However, the C0 signal follows DLL input clock signal GCLK, as described. Therefore, DLL output clock signal CLKOUT follows DLL input clock signal GCLK, as shown in FIG. 4. Also, because control signal Flip_mux6 is low, tristate buffer 322 is tristated, and no contention for signal CLKOUT is provided by tristate buffer 322. Feedback clock signal FBCLK also follows DLL output clock signal CLKOUT, but with a delay inserted by clock network 304.

Also at time Tinit, because signal Reg_en is low, inverting tristate buffers 331 are tristated, and memory elements 311 are all latched. Because reset signal RST is high (DLL_on is low), the memory elements 311 are all holding "zero" values.

At time Ton, the DLL is enabled, i.e., signal DLL_on goes high, and a series of operations occur in sequence, as illustrated in FIG. 4.

At time Ton, control signals Flip_mux2 and Flip_mux6 go high, Ck_mirror1 goes low, and CK_mirror2 remains low. Because signal Flip_mux2 is high, multiplexer 311 selects signal Ck_mirror1 to drive signal C0_mirror. Because signal Flip_mux6 is high, tristate buffer 322 is not tristated, and signal C0_mirror drives signal CLKOUT through delay matching circuit 321. Therefore, driver filter 307 provides the clock output signal CLKOUT, which bypasses delay line 301 and clock multiplexer 303. Thus, delay line 301 is free to perform another function: to count the number of unit delays between two clock edges.

Signal C0 to the delay line 301 is now provided by the feedback clock signal FBCLK, routed through delay matching circuit 320 and multiplexer 312.

Because signals Ck_mirror1 and Ck_mirror2 are low, signals C0, CLKOUT, FBCLK, and STOP all go low or remain low.

At the third input clock cycle after Ton (indicated by the number "3" in FIG. 4), timer circuit 308 drives Reg_en high, and inverted tristate buffers 331 begin to drive memory elements 311. Thus, memory elements 311 receive the current values of C1, C2, . . . , Cn. All of C1, C2, . . . , Cn are low; therefore, the values in memory elements 311 do not change at this time.

At the seventh input clock cycle ("7" in FIG. 4), signal CK_mirror1 goes high and remains high. (As described above, driver filter 307 is designed such that when signal Flip_mux2 goes high, the output of the driver filter goes high after a predetermined number of clock cycles and then remains high.) Therefore, signals CLKOUT, FBCLK, and C0 also go high. There is an appreciable delay (the delay through clock network 304) before signals FBCLK and C0 go high, as shown in FIG. 4. When signal C0 goes high, signals C1, C2, and so forth will also go high in sequence, as the low-to-high transition on signal C0 moves to the right along delay line 301. However, not all of signals C1, C2, . . . , Cn go high, because the next step (at time "8") stops the series of transitions using the STOP signal.

At the eighth input clock cycle ("8" in FIG. 4), signal CK_mirror2 goes high and remains high. (As described above, low filter 309 is designed such that the output goes high one clock cycle after the driver filter output goes high, and then remains high.) Signal STOP consequently goes high also, and in response, timer circuit 308 causes control signals Flip_mux6 and Reg_en to go low. When Reg_en goes low, inverted tristate buffers 331 are all tristated, which latches the current values of C1, C2, . . . , Cn into memory elements 311.

At this time, the contents of memory elements 311 are a series of ones followed by a series of zeros. The number of ones is the number of unit delays between a rising edge on C0 (which mirrors FBCLK) and a rising edge on STOP (which is triggered by a rising edge on GCLK). Therefore, the number of ones is the number of unit delays between the rising edge of signal FBCLK and the next rising edge of signal GCLK. Referring to FIG. 2C, the number of ones is the number of unit delays that need to be added to the feedback clock signal FBCLK to synchronize the feedback clock with the input clock GCLK.

Now that the necessary number of delays has been counted, it is necessary to select the correct intermediate clock signal to synchronize the two clock signals. The correct intermediate clock signal is selected in response to the Flip_mux6 signal going low at the eighth memory cycle. When signal Flip_mux6 goes low, tristate buffer 322 is tristated, and the CLKOUT signal is no longer supplied by the tristate buffer. Instead, signal Flip_mux6 going low also enables decoder circuit 302, which decodes the series of ones and zeros from memory elements 311. The decoded value is then used to control clock multiplexer 303 to select the correct intermediate clock signal to drive CLKOUT.

However, in order to complete the transition from the first (or "counting") mode of the DLL to the second (or "operating") mode, the input to the delay line must be changed. The input signal driving the delay line is controlled by the Flip_mux2 signal, and at the eighth clock cycle, the Flip_mux2 signal is still high.

At the eleventh input clock cycle ("11" in FIG. 4), the Flip_mux2 signal is reset to zero to flip the delay line input from the delayed feedback clock (FBclk_mirror) to the output of the driver filter (CK_mirror1). Because Flip_mux2 is low, driver filter 307 supplies input clock signal GCLK at its output terminal (CK_mirror1), as described above. Therefore, delay line 301 now sees at its input terminal (C0) the input clock signal GCLK.

The DLL circuit is now in "operating" mode. The input clock signal GCLK enters the DLL circuit, and is routed through driver filter 307 and multiplexer 312 to delay line 301. Delay line 301 delays the input clock signal by the appropriate number of delays to ensure that the feedback clock FBCLK is synchronized to the input clock signal GCLK, then provides the appropriately delayed signal as output clock signal CLKOUT to the clock network 304.

After some predetermined number of clock cycles, for example at the seventeenth clock cycle, timer circuit 308 provides optional signal DLL_done, signifying that the clock synchronization process is complete. Signal DLL_done can be used, for example, to enable other circuits on the device that are controlled by the clock network.

Driver Filter

FIG. 5 shows one embodiment of a driver filter 307 that can be used with the embodiment of FIG. 3. Driver filter 307 comprises reset flip-flops 501–504, set flip-flops 505–508, NAND-gates 510–512, and inverters 520–523. Flip-flops 501–507 are coupled in series, with the data input (D) of flip-flop 501 driven by logic high (VDD), and the output (Q) of each flip-flop driving the data input (D) of the next flip-flop in the series. The output (Q) of flip-flop 504 also drives inverter 523, the output of which supplies one input of NAND-gate 510. The other input of NAND-gate 510 is signal Flip_mux2. NAND-gate 510 supplies one input of NAND-gate 511. The other two inputs of NAND-gate 511 are supplied by flip-flop 507 and input clock signal GCLK. NAND-gate 511 supplies one input of NAND-gate 512, which supplies both the clock input of flip-flop 508 and DLL control signal Ck_mirror1. The other input of NAND-gate 512 is supplied by the output of flip-flop 508. The data input of flip-flop 508 is tied low (GND).

Input clock signal GCLK is also supplied to a first inverter 521, which supplies signal GCLKB. Signal GCLKB drives both the clock terminals of flip-flops 505–507 and a second inverter 522. The output of second inverter 522 supplies the clock signal to flip-flops 501–504. DLL control signal Flip_mux2 is inverted by inverter 520 to produce signal Flip_mux2B, which drives the reset terminals of flip-flops 501–504 and the set terminals of flip-flops 505–508.

The behavior of driver filter 307 was described above, in reference to FIG. 3.

Low Filter

FIG. 6 shows one embodiment of a low filter 309 that can be used with the embodiment of FIG. 3. Low filter 309 comprises reset flip-flops 601–605, set flip-flops 606–609, NAND-gates 611–612, and inverters 620–622. Flip-flops 601–608 are coupled in series, with the data input (D) of flip-flop 601 driven by logic high (VDD), and the output (Q) of each flip-flop driving the data input (D) of the next flip-flop in the series. The output (Q) of flip-flop 605 also supplies one input of NAND-gate 611. The other two inputs of NAND-gate 611 are supplied by flip-flop 608 and input clock signal GCLK. NAND-gate 611 supplies one input of NAND-gate 612, which supplies both the clock input of flip-flop 609 and DLL control signal Ck_mirror2. The other input of NAND-gate 612 is supplied by the output of flip-flop 609. The data input of flip-flop 609 is tied low (GND).

Input clock signal GCLK is also supplied to a first inverter 621, which supplies signal GCLKB. Signal GCLKB drives both the clock terminals of flip-flops 606–608 and a second inverter 622. The output of second inverter 622 supplies the clock signal to flip-flops 601–605. DLL control signal DLL_on is inverted by inverter 620 to produce signal DLL_onB, which drives the reset terminals of flip-flops 601–605 and the set terminals of flip-flops 606–609.

The behavior of low filter 309 was described above, in reference to FIG. 3.

Timer Circuit

FIG. 7 shows one embodiment of a timer circuit 308 that can be used with the embodiment of FIG. 3. Timer circuit 308 comprises reset flip-flops 701–712, NAND-gate 731, inverters 720–724, NOR-gates 741–742, and exclusive OR-gate (XOR-gate) 751. Flip-flops 701–709 are coupled in series, with the data input (D) of flip-flop 701 driven by logic high (VDD), and the output (Q) of each flip-flop driving the data input (D) of the next flip-flop in the series. The output (Q) of flip-flop 709 supplies optional control signal DLL_done. The output (Q) of flip-flop 703 also supplies one input of XOR-gate 751. The other input of XOR-gate 751 is DLL control signal DLL_on. XOR-gate 751 supplies DLL control signal Flip_mux2. DLL control signal DLL_on is also inverted by inverter 723, which drives the reset terminals of flip-flops 701–712. Flip-flops 701–712 also have disable terminals (or enable-bar terminals) ENB, which are driven by signal STOPB, signal STOP inverted by inverter 720. Flip-flops 701–712 are each clocked by signal GCLK, twice inverted by inverters 721 and 722 coupled in series.

The output (Q) of flip-flop 712 supplies one input of NAND-gate 731. The other input of NAND-gate 731 is DLL control signal Flip_mux2. NAND-gate 731 supplies one input of NOR-gate 741. The other input of NOR-gate 741 is signal STOP, and NOR-gate 741 generates control signal Reg_en. Control signal Flip_mux6 is provided by NOR-gate 742 from signal STOP and the inverse of signal Flip_mux2 (inverted by inverter 724).

The behavior of timer circuit 308 was described above, in reference to FIG. 3.

Second Detailed Embodiment

Figure 8:
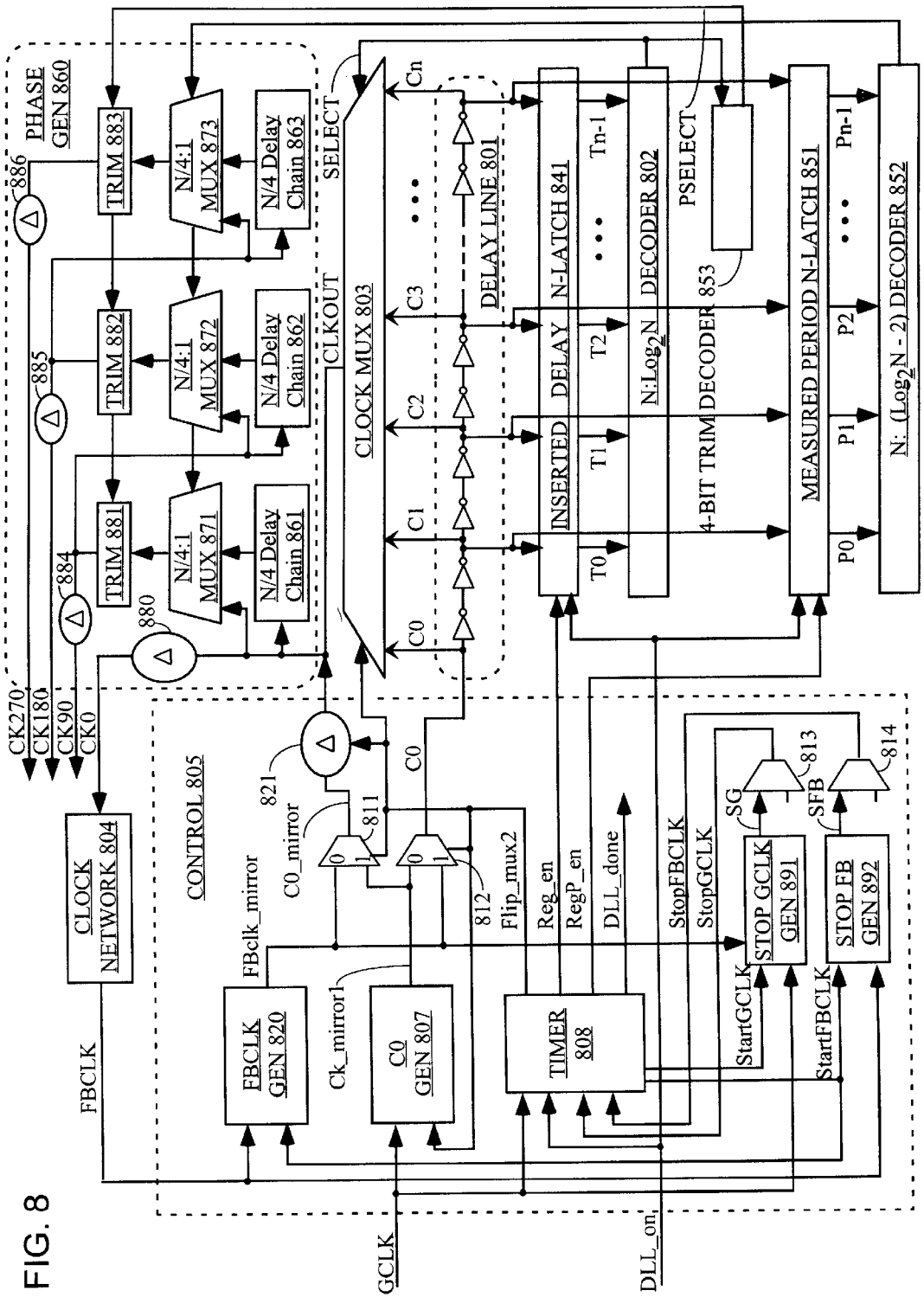
FIG. 8 is a block diagram of another embodiment of the invention.

FIG. 8 shows a block diagram of a DLL circuit according to another embodiment of the invention. This embodiment provides additional functionality in the form of phased output signals. In the pictured embodiment, there are four output signals separated by a 90 degree phase differential.

The embodiment of FIG. 8 includes a delay line 801, an inserted delay N-bit latch 841, an N:log(2)N decoder 802, a measured period N-bit latch 851, an N:(log(2)N−2) decoder 852, a 4-bit trim decoder 853, a phase generator circuit 860, a control circuit 805, and a clock network 804.

Clock network 804 provides a feedback clock signal FBCLK that drives both control circuit 805 and other circuits in the IC.

Delay line 801 is driven by control circuit 805, which provides to the delay line a signal C0 derived either from feedback clock signal FBCLK (in a first mode) or from input clock signal GCLK (in a second mode). Delay line 801 provides a plurality of intermediate clock signals, respectively delayed by 0, 1, . . . , n unit delays from the signal C0. Thus, delay line 801 provides from signal C0 a first plurality of intermediate clock signals to latches 841 and 851, and a second plurality of intermediate clock signals to clock multiplexer 803. The first plurality of intermediate clock signals are stored (e.g., latched) in each of latches 841 and 851, but at different times in the feedback clock cycle, as is now described.

Inserted delay latch circuit 841 "counts" and stores the number of unit delays between a rising edge of the feedback clock signal FBCLK and the following rising edge of the input clock signal GCLK. Decoder circuit 802 then uses this counted number of unit delays to control clock multiplexer 803. Thus, latch circuit 841 and decoder 802 perform the same functions as memory elements 311 and decoder 302 in the embodiment of FIG. 3.

Measured period latch circuit 851 "counts" and stores the number of unit delays between a rising edge of the feedback clock signal FBCLK and the following rising edge of the same signal. Thus, latch circuit 851 stores the number of unit delays in one feedback clock period. Because feedback clock signal FBCLK and input clock signal GCLK have the same clock period, latch circuit 851 also stores the number of unit delays in one input clock period.

Decoder circuit 852 is two bits narrower than decoder circuit 802 (i.e., generates two fewer output signals), because the pictured embodiment generates a four phase output clock signal. This reduction in the number of bits corresponds to a "divide-by-four" function. In other words, for example, if an input clock period includes 8, 9, 10, or 11 unit delays, decoder circuit 852 selects 2 unit delays for each phased output clock path through MUX 871–873.

Thus, each phased output clock is delayed by an additional one-fourth of an input clock period from the previous phased clock. Output clock CK90 is delayed by one-fourth of an input clock period from output clock CK0. Output clock CK180 is delayed by one-fourth of an input clock period from output clock CK90, and by one-half of an input clock period from output clock CK0. Output clock CK270 is delayed by one-fourth of an input clock period from output clock CK180, and by three-quarters of an input clock period from output clock CK0.

The two least significant bits from decoder 802 are decoded separately in trim decoder 853. Each selected bit adds one-fourth of a unit delay to the phased output clocks using trim circuits 881–883, as described below in connection with FIG. 9. Thus, trim decoder 853 and trim circuits 881–883 are optional, and optionally add an additional level of accuracy to the timing of phased output clocks signals C90, CK180, and CK270. For example, if an input clock period includes 8 unit delays, phase select signals PSELECT select the paths through trim circuits 881–883 with no additional quarter-delays. If the input clock period includes 9 unit delays, signals PSELECT select the paths with an additional one-fourth unit delay, and so forth.

In one embodiment (not shown), trim decoder 853 uses the two least significant bits from decoder 852 instead of from decoder 802. The trim decoder output is periodic, therefore the two least significant bits of the two decoder output signals are the same.

Clock multiplexer 803 selects one of the second plurality of intermediate clock signals derived from input clock signal GCLK and provides the selected signal as signal CLKOUT to clock network 804. As described with reference to FIG. 3, clock multiplexer 803 (under control of decoder circuit 802) selects the intermediate clock signal subject to the necessary additional delay to synchronize feedback clock signal FBCLK to input clock signal GCLK. The selected clock signal CLKOUT is provided to the clock network as unphased clock signal CK0, and also drives phase generator circuit 860.

In the embodiment of FIG. 8, phase generator circuit 860 includes three similar sections, each of which provides one phased clock signal. Unphased clock signal CK0 is delayed by one fourth of an input clock period in delay chain 861 and trim circuit 881, by another fourth of an input clock period in delay chain 862 and trim circuit 882, and by a final fourth in delay chain 863 and trim circuit 883. One clock signal is selected from each quarter period by multiplexers 871, 872, and 873 and fed to the next delay chain in the series. The selected clock signals are also provided to trim circuits 881, 882, and 883, respectively.

Figure 9:
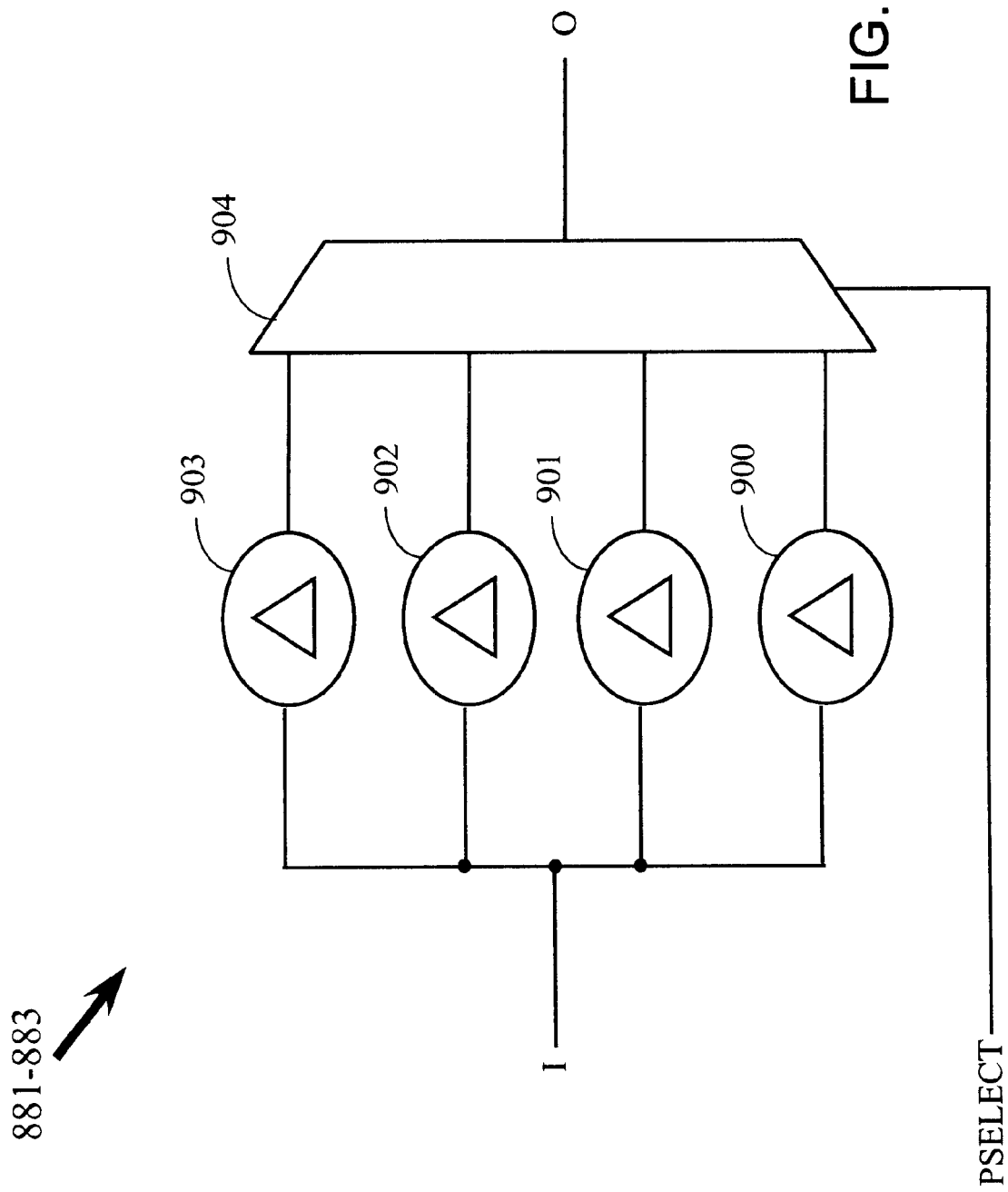
FIG. 9 is a block diagram of a trim circuit that can be used with the embodiment of FIG. 8.

FIG. 9 shows an exemplary trim circuit 881–883 for the embodiment of FIG. 8. The trim circuit of FIG. 9 includes four paths between the input terminal I and the output terminal O. Each path includes a respective delay element 900–903. Each delay element has a different delay, such that the delay from "I" to "O" between the different paths is a multiple of ¼ of a unit delay. Delay elements 900–903 can be implemented, for example, using inverters having different device sizes, or by including resistors having different resistance values in the various paths.

Trim decoder 853 provides phase select signals PSELECT to the trim circuits. Based on the PSELECT signals, exactly one of the paths is selected using, for example, multiplexer 904. Thus, a delay of 0, ¼, ½, or ¾ unit delays is inserted for each phased clock with respect to signal CK0. In some embodiments, the delay elements are implemented differently, or the trim circuit is omitted.

Phase generator circuit 860 also preferably includes a delay matching circuit 880, which is included to ensure a similar delay between unphased clock signal CK0 and the phased clocks signals C90, CK180, and CK270, and delay matching circuits 884–886, which are included to ensure that each of the phased clock signals has the same delay through its respective clock network (not shown).

Each step of the counting and selection process is controlled by control circuit 805. FIG. 8 illustrates one embodiment of control circuit 805. However, it will be clear to those of ordinary skill in the art that the DLL of the invention can be implemented using other control circuits. Provided that the DLL circuit functions substantially as described above, the implementation of control circuit 805 can vary, and such variations fall within the scope of the present invention.

In the embodiment of FIG. 8, control circuit 805 includes multiplexers 811–814, tristatable delay matching circuit 821, C0 clock generator circuit 807, FBCLK clock generator circuit 820, stop GCLK generator circuit 891, stop FBCLK generator circuit 892, and timer circuit 808.

Multiplexer 813 is provided between stop GCLK generator circuit 891 and timer circuit 808 to match the loading between signals SG and CK_mirror1. Multiplexer 814 is provided between stop FBCLK generator circuit 892 and timer circuit 808 to match the loading between signals SFB and CK_mirror1. Tristatable delay matching circuit 821 is provided between signals C0_mirror and CLKOUT to match the delay and loading between signals C0_mirror and C0, and to give signal Flip_mux2 control over when signal C0_mirror drives signal CLKOUT. In other embodiments, other delay matching techniques can be used to match the signal characteristics of the three signals CK_mirror1, SG, and SFB, and to match the signal characteristics of the two signals C0 and C0_mirror.

Figure 11:
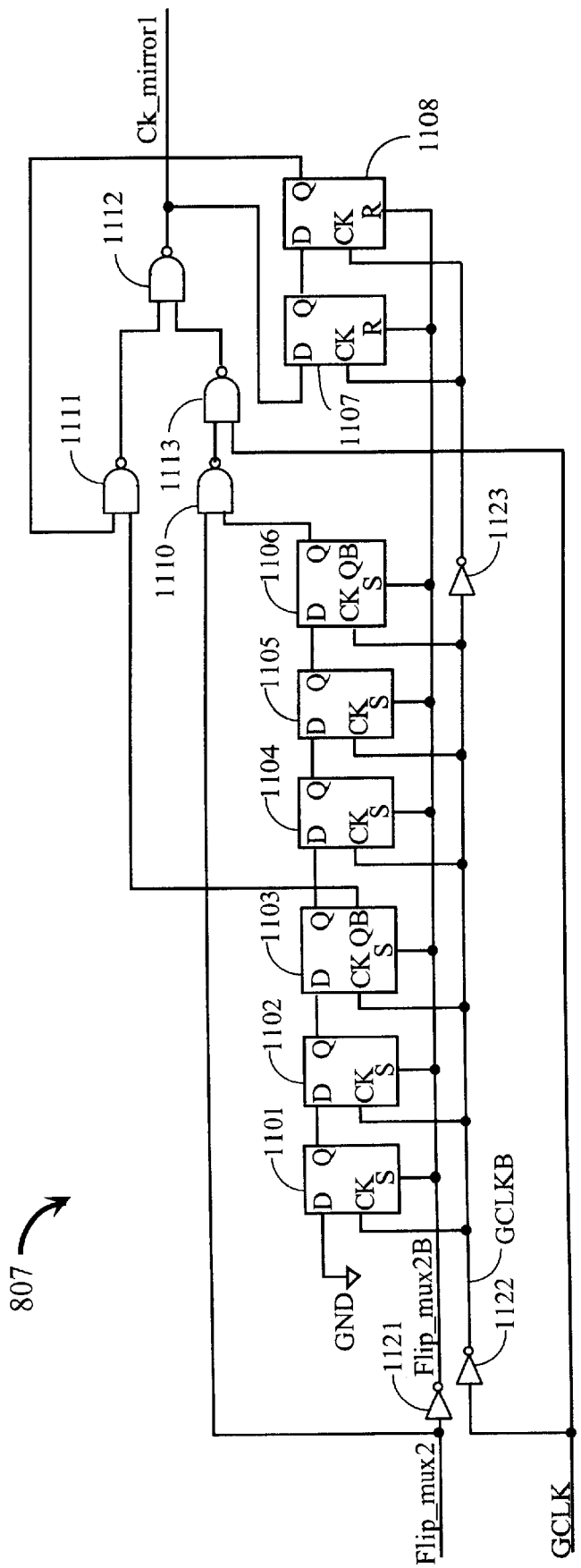
FIG. 11 is a block diagram of a C0 clock generator circuit that can be used with the embodiment of FIG. 8.

C0 clock generator circuit 807 behaves as follows. If signal Flip_mux2 is low, then the output (CK_mirror1) of the circuit echoes the input signal (GCLK). If signal Flip_mux2 is high, then the output (CK_mirror1) of the circuit goes low for a predetermined number of GCLK clock cycles, permits three GCLK clock edges (rising, falling, and rising again) to filter through the circuit, then goes high and stays high. Therefore, C0 clock generator circuit 807 behaves either as a driver circuit (if signal Flip_mux2 is low), or as a 2 rising_edge filter with a delay of a predetermined number of GCLK clock cycles (if signal Flip_mux2 is high). One implementation of C0 clock generator circuit 807 is shown in FIG. 11 and is described below with reference to that figure.

Figure 12:
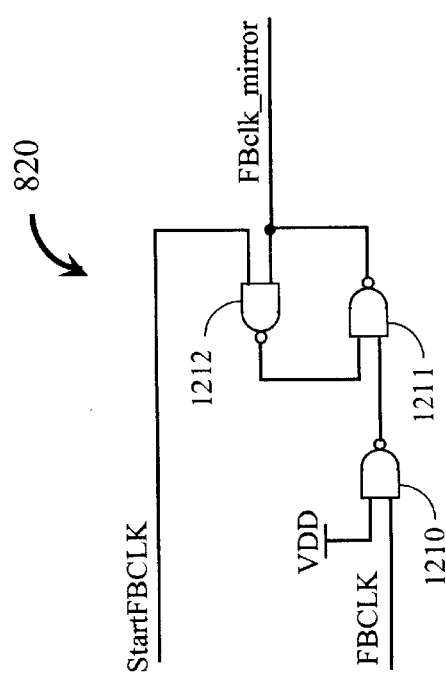
FIG. 12 is a block diagram of a FBCLK clock generator circuit that can be used with the embodiment of FIG. 8.

FBCLK clock generator circuit 820 behaves as follows. If signal StartFBCLK is low, then the output (FBclk_mirror) of the circuit echoes the input signal (FBCLK). If signal StartFBCLK is high, then the output (FBclk_mirror) of the circuit goes from low to high at the next rising edge of signal FBCLK, then stays high. Therefore, FBCLK clock generator circuit 820 behaves either as a driver circuit (if signal StartFBCLK is low), or as a 1-edge filter (if signal StartFBCLK is high). One implementation of FBCLK clock generator circuit 820 is shown in FIG. 12 and is described below with reference to that figure.

Figure 13:
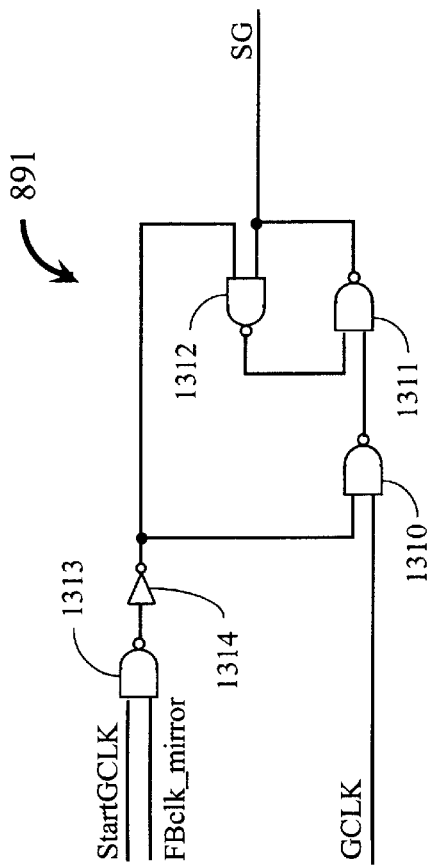
FIG. 13 is a block diagram of a stop GCLK generator circuit that can be used with the embodiment of FIG. 8.

Stop GCLK generator circuit 891 behaves as follows. If either of signals StartGCLK and FBclk_mirror is low, then the output (SG) of stop GCLK generator circuit 891 is low. If signals FBclk_mirror and StartGCLK are both high, then the output (SG) of stop GCLK generator circuit 891 goes from low to high at the next rising edge of signal GCLK, then stays high. Therefore, stop GCLK generator circuit 891 behaves either as a connection to ground (if either of signals StartGCLK and FBclk_mirror is low), or as a 1-edge filter (if signals StartGCLK and FBclk_mirror are both high). One implementation of stop GCLK generator circuit 891 is shown in FIG. 13 and is described below with reference to that figure.

Figure 14:
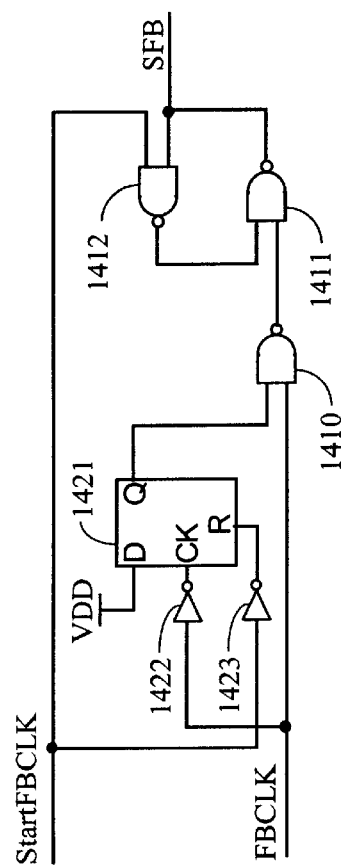
FIG. 14 is a block diagram of a stop .FBCLK generator circuit that can be used with the embodiment of FIG. 8.

Stop FBCLK generator circuit 892 behaves as follows. If signal StartFBCLK is low, then the output (SFB) of stop FBCLK generator circuit 892 is low. If signal StartFBCLK is high, then at the second rising edge of the FBCLK clock signal the output (SFB) of stop FBCLK generator circuit 892 goes from low to high, then stays high. Therefore, stop FBCLK generator circuit 892 behaves either as connection to ground (if signal StartFBCLK is low), or as a 1-edge filter with one FBCLK clock cycle delay (if signal StartFBCLK is high). One implementation of stop FBCLK generator circuit 892 is shown in FIG. 14 and is described below with reference to that figure.

Note that once signal StartFBCLK goes high, signal FBclk_mirror goes high at the next rising edge of FBCLK, while signal StopFBCLK goes high at the second rising edge of FBCLK. Thus, signals FBclk_mirror and StopFBCLK have rising edges separated by one FBCLK clock period.

Figure 10:
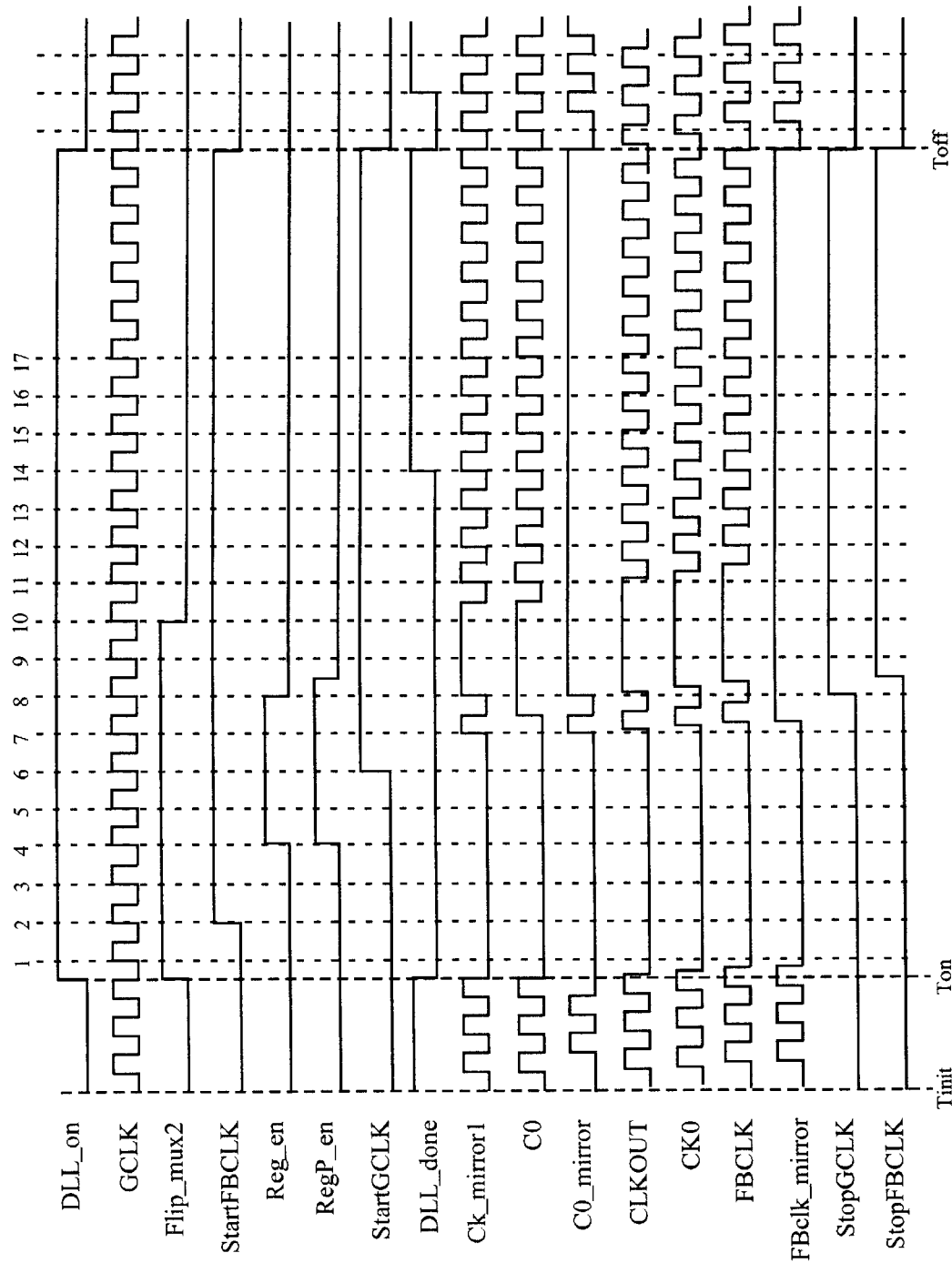
FIG. 10 is a timing diagram illustrating the functionality of the embodiment of FIG. 8.
Figure 15:
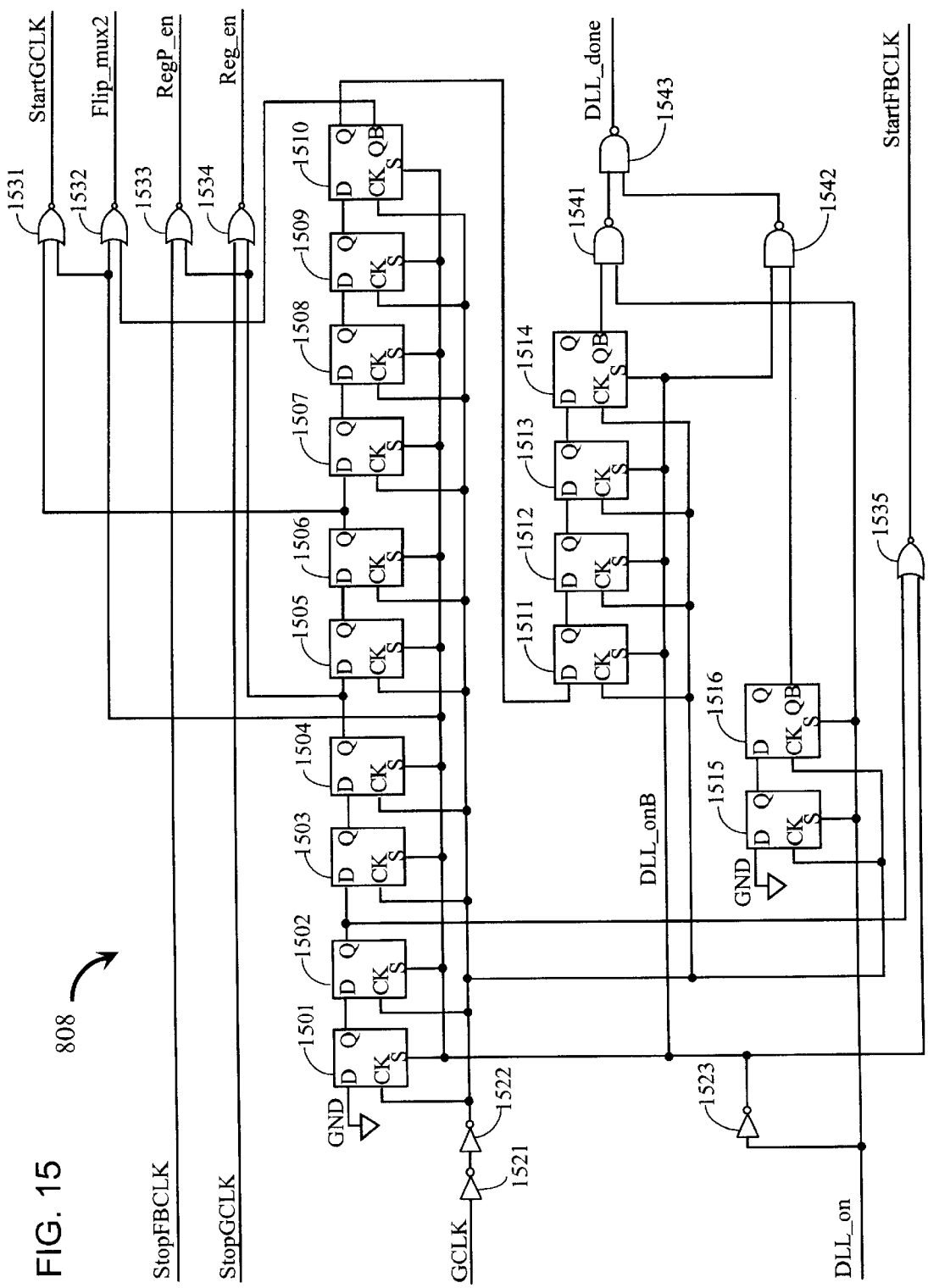
FIG. 15 is a block diagram of a timer circuit that can be used with the embodiment of FIG. 8.

Timer circuit 808 is a state machine that generates control signals StartFBCLK, Reg_en, RegP_en, StartGCLK, Flip_mux2, and DLL_done in a predetermined sequence and with predetermined timing. One implementation of timer circuit 808 is shown in FIG. 15 and is described below with reference to that figure. The predetermined sequence and predetermined timing of control signals StartFBCLK, Reg_en, RegP_en, StartGCLK, Flip_mux2, and DLL_done are shown in FIG. 10.

Signals Reg_en and DLL_on control inserted delay N-bit latch 841 as follows. If DLL_on is low, then the N-bit latch is reset, and the latch outputs (T0, T1, . . . , Tn−1) are low. If DLL_on is high, then the latch is enabled. If signal Reg_en is high, then the latch holds the current signals (C1, C2, . . . , Cn) from delay line 801; i.e., the latch can receive new data. If Reg_en is low, then the previous signals from delay line 801 are latched.

Decoder circuit 802 generates output signals (SELECT) that enable clock multiplexer 803 to select the appropriate intermediate clock signal to generate the unphased output clock signal CK0. For example, if all of signals T0, T1, . . . , Tn−1 are low, then clock multiplexer 803 selects the C0 intermediate clock signal. If T<0:n−1> is 1110000000 . . . 0, then intermediate clock signal C3 is selected because there are three high signals. Decoder circuit 802 follows this pattern, thereby essentially "counting" the number of high signals in latched clock signals T0, T1, Tn−1 and using this number to select the appropriate clock signal.

Signals RegP_en and DLL_on control measured period N-bit latch 851 as follows. If DLL_on is low, then the N-bit latch is reset, and the latch outputs (P0, P1, . . . , Pn−1) are low. If DLL_on is high, then the latch is enabled. If signal RegP_en is high, then the latch holds the current signals (C1, C2, . . . , Cn) from delay line 801; i.e., the latch can receive new data. If ReqP_en is low, then the previous signals from delay line 801 are latched.

Decoder circuit 852 generates output signals that enable multiplexers 871–873 to select the appropriate delayed clock signals (delayed by delay chains 861–863) to generate phased output clock signals CK90, CK180, and CK270. As noted above, only the (N−4) most significant bits are used. Decoder circuit 852 essentially "counts" the number of high signals in latched clock signals P4, P5, . . . , Pn−1 and uses this number to select the appropriate delayed clock signal.

Trim decoder circuit 853 generates output signals PSELECT that enable trim circuits 881–883 to select the appropriate number of quarter-unit delays to be added to each of phased output clock signals CK90, CK180, and CK270.

Timing Diagram

The functionality of the DLL circuit of FIG. 8 is now described with reference to the timing diagram of FIG. 10.

Initially, at time Tinit, the DLL is disabled, i.e., signal DLL_on is low. DLL control signals Flip_mux2, StartFBCLK, Reg_en, RegP_en, and StartGCLK are all low, as are signals StopGCLK, StopFBCLK, T<0:n−1>, and P<0:n−1>. Therefore, the DLL input clock signal GCLK is routed through C0 clock generator circuit 807 to signal CK_mirror1, which therefore follows signal GCLK, as shown in FIG. 10.

Signal CK_mirror1 is selected by multiplexer 812 (because control signal Flip_mux2 is low) and is provided to delay line 801 as signal C0. Decoder circuit 802 provides SELECT control signals that enable clock multiplexer 803 to select the C0 intermediate clock signal, as described above. However, the C0 signal follows DLL input clock signal GCLK. Therefore, DLL output clock signal CLKOUT follows DLL input clock signal GCLK, as shown in FIG. 10.

In the pictured embodiment, a low value on signal Flip_mux2 tristates delay element 821 and enables clock multiplexer 803, so that clock multiplexer 803 is the sole source of unphased output clock signal CK0. Additionally, a low value on signal DLL_on forces multiplexers 871–873 and trim circuits 881–883 to select signals and paths such that no delay is added. Thus, each of the phased output clock signals has the same delay as the unphased clock, i.e., no delay. Thus, when the DLL circuit is disabled, all of the output clock signals are the same.

Feedback clock signal FBCLK also follows DLL output clock signal CLKOUT, but with a delay inserted by clock network 804.

Also at time Tinit, because signal DLL_on is low, all bits of inserted delay N-bit latch 841 and measured period N-bit latch 851 are low.

At time Ton, the DLL is enabled, i.e., signal DLL_on goes high, and a series of operations occur in sequence, as illustrated in FIG. 10. At this point, the DLL circuit enters the "counting" mode, wherein each of N-bit latches 841 and 851 counts a number of unit delays between two different clock edges. The counting process will begin at the next rising edge of signal FBclk_mirror.

At time Ton, as a result of the high value on signal DLL_on, control signal Flip_mux2 goes high, Ck_mirror1 goes low, and StartGCLK and StartFBCLK both remain low. Because signal Flip_mux2 is high, multiplexer 811 selects signal Ck_mirror1 to drive signal C0_mirror. Also because signal Flip_mux2 is high, signal C0_mirror drives signal CLKOUT through delay matching circuit 821. Therefore, C0 clock generator circuit 807 provides the clock output signal CLKOUT, which bypasses delay line 801 and clock multiplexer 803. In the pictured embodiment, a high value on signal Flip_mux2 also tristates clock multiplexer 803, so that tristatable delay matching circuit 821 is the sole source of unphased output clock signal CK0.

Thus, delay line 801 is free to perform another function: to assist N-bit latches 841 and 851 in counting the number of unit delays between clock edges. N-bit latch 841 will count the number of unit delays between successive rising edges of FBCLK and GCLK. N-bit latch 851 will count the number of unit delays between two successive rising edges of FBCLK.

Signal C0 to delay line 801 is now provided by the feedback clock signal FBCLK, routed through FBCLK clock generator circuit 820 and multiplexer 812.

As described above, when control signal Flip_mux2 goes high, the output (CK_mirror1) of C0 generator circuit 807 goes low for a predetermined number of GCLK clock cycles, permits three GCLK clock edges (rising, falling, and rising again) to filter through the circuit, then goes high and stays high. Thus, in response to Flip_mux2 going high, signal CK_mirror1 goes low at time Ton, pulses high at the seventh GCLK input clock cycle after Ton ("time 7") with the GCLK signal, and goes high again at time 8, where it remains until after Flip_mux2 goes low again at time 10.

At time 2, timer circuit 808 drives signal StartFBCLK high. Because signal FBCLK is low, none of the other signals shown in FIG. 10 change value at this time. However, FBCLK clock generator circuit 820 and stop FBCLK generator circuit 892 are now enabled and waiting for the next rising FBCLK edge (in the case of circuit 820) and the second rising FBCLK edge (in the case of circuit 892) to send signals FBclk_mirror and SFB high, respectively.

At time 4, timer circuit 808 drives signals Reg_en and RegP_en high, and latches 841 and 851 each receive the current values of C1, C2, . . . , Cn. All of C1, C2, . . . , Cn are low; therefore, the values in latches 841 and 851 do not change at this time. However, when intermediate clock signal C0 changes value, the latches will be ready to count the number of unit delays between clock edges.

At time 6, timer circuit 808 drives signal StartGCLK high. As noted above, when signals FBclk_mirror and StartGCLK are both high, then the output (SG) of stop GCLK generator circuit 891 goes from low to high at the next rising edge of signal GCLK, then stays high. However, at time 6, signal FBclk_mirror is still low. (Signal FBclk_mirror is required to be high in case the delay from signal GCLK to signal FBCLK is more than one clock cycle.)

At time 7, signal CK_mirror1 goes high, as the predetermined number of clock cycles referenced with regard to control signal Flip_mux2 has elapsed. In response to CK_mirror1 going high, signal C0_mirror also goes high, followed (in order) by signals CLKOUT, CK0, FBCLK, and FBclk_mirror. There is an appreciable delay (the delay through clock network 804) before signals FBCLK and FBclk_mirror go high, as shown in FIG. 10.

Signal C0 then goes high, in response to signal FBclk_mirror going high. When signal C0 goes high, signals C1, C2, and so forth will also go high in sequence, as the low-to-high transition on signal C0 moves to the right along delay line 801.

At time 8, because signals FBclk_mirror and StartGCLK are both high, signals SG and StopGCLK both change from low to high in response to the rising edge of signal GCLK (time t8). When signal StopGCLK goes high, signal Reg_en goes low, and the current value of C1, C2, . . . , Cn is latched in N-bit latch 841. Thus, the value latched in N-bit latch 841 represents the number of unit delays between the rising edge of FBclk mirror and the falling edge of signal Reg_en, or, to put it another way, the number of unit delays between the rising edge of FBCLK and the next rising edge of GCLK.

As noted above, when signal StartFBCLK is high, then at the second rising edge of the FBCLK clock signal the output (SFB) of stop FBCLK generator circuit 892 goes from low to high, then stays high. Thus, when the second rising edge of signal FBCLK occurs (after time t8), signals SFB and StopFBCLK both go high.

When signal StopFBCLK goes high, signal RegP_en goes low, and the current value of C1, C2, . . . , Cn is latched in N-bit latch 851. Thus, the value latched in N-bit latch 851 represents the number of unit delays between the rising edge of FBclk_mirror and the falling edge of signal RegP_en, or, to put it another way, the number of unit delays between a first rising edge of FBCLK and the next rising edge of FBCLK.

To complete the transition from the first (or "counting") mode of the DLL to the second (or "operating") mode, the input to the delay line must be changed. The input signal driving the delay line is controlled by the Flip_mux2 signal, and at time 8, signal Flip_mux2 is still high.

At time 10, signal Flip_mux2 goes low again. As described above, in the pictured embodiment a low value on signal Flip_mux2 tristates delay element 821 and enables clock multiplexer 803, so that clock multiplexer 803 is the sole source of unphased output clock signal CK0. Intermediate clock signal C0 is now supplied by signal CK_mirror1 (via multiplexer 812). Clock multiplexer 803 is enabled and delay element 821 is tristated, so the DLL circuit begins to use the decoded values to select the appropriate intermediate clock signals to provide as output signals, as described above.

At time 14, timer circuit 808 drives signal DLL_done high, signifying that the clock synchronization process is complete.

Note that DLL_done behaves differently in the embodiment of FIG. 8 than in the previously described embodiment of FIG. 3. In the embodiment of FIG. 3, DLL_done is low whenever the DLL is disabled (i.e., whenever DLL_on is low). In the embodiment of FIG. 8, DLL_done only goes low for two rising edges of signal GCLK. During this period, the DLL is reset by the DLL_on signal such that the output clock signals are all the same and include no additional delay. Thus, when the DLL_done signal goes high again after the second rising edge of GCLK, the signal communicates to other ICs in the system that the IC including the DLL is ready for additional communication.

The DLL circuit is now in "operating" mode. The input clock signal GCLK enters the DLL circuit, and is routed through C0 clock generator circuit 807 and multiplexer 812 to delay line 801. Delay line 801 delays the input clock signal by the appropriate number of delays to ensure that the feedback clock FBCLK is synchronized to the input clock signal GCLK, then provides the appropriately delayed signal via output clock signal CLKOUT to unphased output clock signal CK0. Phase generator circuit 860 supplies appropriately delayed phased output clock signals CK90, CK180, and CK270.

Subcircuits

FIG. 11 shows one embodiment of a C0 clock generator circuit 807 that can be used with the embodiment of FIG. 8. C0 clock generator circuit 807 comprises set flip-flops 1101–1106, reset flip-flops 1107–1108, NAND-gates 1110–1113, and inverters 1121–1123. Flip-flops 1101–1106 are coupled in series, with the data input (D) of flip-flop 1101 driven by ground (GND), and the output (Q) of each flip-flop driving the data input (D) of the next flip-flop in the series. Flip-flops 1107–1108 are also coupled in series, with the data input (D) of flip-flop 1107 driven by signal Ck_mirror1.

The inverse output (QB) of flip-flop 1103 also drives one input terminal of NAND-gate 1111. The other input of NAND-gate 1111 is the output (Q) of flip-flop 1108. The output (Q) of flip-flop 1106 also drives one input terminal of NAND-gate 1110. The other input of NAND-gate 1110 is signal Flip_mux2. NAND-gate 1110 supplies one input of NAND-gate 1113. The other input of NAND-gate 1113 is input clock signal GCLK. NAND-gates 1111 and 1113 each supply one input of NAND-gate 1112, which supplies DLL control signal Ck_mirror1.

Input clock signal GCLK is also supplied to a first inverter 1122, which supplies signal. GCLKB. Signal GCLKB drives both the clock terminals of flip-flops 1101–1106 and a second inverter 1123. The output of second inverter 1123 supplies the clock signal to flip-flops 1107–1108. DLL control signal Flip_mux2 is inverted by inverter 1121 to produce signal Flip_mux2B, which drives the set terminals of, flip-flops 1101–1106 and the reset terminals of flip-flops 1107–1108.

The behavior of C0 clock generator circuit 807 was described above, in reference to FIG. 8.

FIG. 12 shows one embodiment of an FBCLK clock generator circuit 820 that can be used with the embodiment of FIG. 8. FBCLK clock generator circuit 820 comprises NAND-gates 1210–1212. NAND-gates 1211–1212 are cross-coupled, with the second input to NAND-gate 1212 driven by signal StartFBCLK and the second input to NAND-gate 1211 driven by NAND-gate 1210. The output of NAND-gate 1211 also supplies signal FBclk_mirror. NAND-gate 1210 has two inputs driven by signal FBCLK and power high VDD. Thus, NAND-gate 1210 functions as an inverter, which is implemented as a NAND-gate in order to balance delays and match loading between signals FBCLK and GCLK. Other well known methods of balancing delays and loading are preferably used throughout the various embodiments pictured herein.

The behavior of FBCLK clock generator circuit 820 was described above, in reference to FIG. 8.

FIG. 13 shows one embodiment of a stop GCLK generator circuit 891 that can be used with the embodiment of FIG. 8. Stop GCLK generator circuit 891 comprises NAND-gates 1310–1313 and inverter 1314. NAND-gates 1311–1312 are cross-coupled, with the second input to NAND-gate 1312 driven by inverter 1314 and the second input to NAND-gate 1311 driven by NAND-gate 1310. The output of NAND-gate 1311 also supplies signal SG. NAND-gate 1310 has two inputs driven by signal GCLK and inverter 1314. NAND-gate 1313 is driven by signals StartGCLK and FBclk_mirror, and drives inverter 1314.

The behavior of stop GCLK generator circuit 891 was described above, in reference to FIG. 8.

FIG. 14 shows one embodiment of a stop FBCLK generator circuit 892 that can be used with the embodiment of FIG. 8. Stop FBCLK generator circuit 892 comprises NAND-gates 1410–1412, reset flip-flop 1421, and inverters 1422–1423. NAND-gates 1411–1412 are cross-coupled, with the second input to NAND-gate 1412 driven by signal StartFBCLK and the second input to NAND-gate 1411 driven by NAND-gate 1410. The output of NAND-gate 1411 also supplies signal SFB. NAND-gate 1410 has two inputs driven by signal FBCLK and the output (Q) of flip-flop 1421. The data input (D) of flip-flop 1421 is coupled to power high VDD, the clock input (CK) is signal FBCLK inverted by inverter 1422, and the reset input (R) is signal StartFBCLK inverted by inverter 1423.

The behavior of stop FBCLK generator circuit 892 was described above, in reference to FIG. 8.

FIG. 15 shows one embodiment of a timer circuit 808 that can be used with the embodiment of FIG. 8. Timer circuit 808 comprises set flip-flops 1501–1516, NAND-gates 1541–1543, inverters 1521–1523, and NOR-gates 1531–1535. Flip-flops 1501–1514 are coupled in series, with the data input (D) of flip-flop 1501 driven by ground (GND), and the output (Q) of each flip-flop driving the data input (D) of the next flip-flop in the series. Flip-flops 1515–1516 are also coupled in series, with the data input (D) of flip-flop 1515 driven by ground (GND).

DLL control signal DLL_on is inverted by inverter 1523 to provide signal DLL onB, which drives the set terminals of flip-flops 1501–1514. The set terminals of flip-flops 1515–1516 are driven by signal DLL_on. Flip-flops 1501–1516 are each clocked by signal GCLK, twice inverted by inverters 1521 and 1522 coupled in series.

The output (Q) of flip-flop 1502 supplies one input of NOR-gate 1535. The other input of NOR-gate 1535 is signal DLL_onB. NOR-gate 1535 supplies DLL control signal StartFBCLK.

The output (Q) of flip-flop 1504 supplies one input of NOR-gate 1534. The other input of NOR-gate 1534 is signal StopGCLK. NOR-gate 1534 supplies DLL control signal Reg_en. The output (Q) of flip-flop 1504 also supplies one input of NOR-gate 1533. The other input of NOR-gate 1533 is signal StopFBCLK. NOR-gate 1533 supplies DLL control signal RegP_en.

The output (Q) of flip-flop 1506 supplies one input of NOR-gate 1531. The other input of NOR-gate 1531 is signal DLL_onB. NOR-gate 1531 supplies DLL control signal StartGCLK.

The inverse output (QB) of flip-flop 1510 supplies one input of NOR-gate 1532. The other input of NOR-gate 1532 is signal DLL_onB. NOR-gate 1532 supplies DLL control signal Flip_mux2.

The inverse output (QB) of flip-flop 1514 supplies one input of NAND-gate 1541. The other input of NAND-gate 1541 is signal DLL_on. NAND-gate 1541 supplies one input to NAND-gate 1543. The inverse output (QB) of flip-flop 1516 supplies one input of NAND-gate 1542. The other input of NAND-gate 1542 is signal DLL_onB. NAND-gate 1542 supplies the other input to NAND-gate 1543. NAND-gate 1543 supplies signal DLL_done.

The behavior of timer circuit 808 was described above, in reference to FIG. 8.

Those having skill in the relevant arts of the invention will now perceive various modifications and additions that may be made as a result of the disclosure herein. For example, the above text describes the invention in the context of ICs. However, the invention can also be applied to many other systems. Further, filters, clock networks, delay matching circuits, unit delays, delay lines, timer circuits, tristate buffers, memory elements, multiplexers, latch circuits, phase generator circuits, decoder circuits, and control circuits other than those described herein can be used to implement the invention.

Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A delay-lock loop (DLL) circuit, comprising:
   a feedback input terminal;
   an input clock terminal;
   a plurality of phased output clock terminals;
   a delay line coupled to the feedback input terminal in a first mode and the input clock terminal in a second mode, the delay line having a plurality of output terminals;
   a first latch circuit having input terminals coupled to the output terminals of the delay line and further having output terminals;
   a first decoder circuit having input terminals coupled to the output terminals of the first latch circuit and further having output terminals;
   a clock multiplexer circuit having data input terminals coupled to the output terminals of the delay line, select terminals coupled to the output terminals of the first decoder circuit, and an output terminal;
   a second latch circuit having input terminals coupled to the output terminals of the delay line and further having output terminals;
   a second decoder circuit having input terminals coupled to the output terminals of the second latch circuit and further having output terminals;
   a phase generator circuit having a first input terminal coupled to the output terminal of the clock multiplexer circuit, control input terminals coupled to the output terminals of the second decoder circuit, and output terminals coupled to the plurality of phased output clock terminals; and
   a control circuit coupled to the first and second latch circuits, the delay line, and the clock multiplexer circuit.

2. The DLL circuit of claim 1, wherein:
   the delay line comprises a series of N unit delays;
   the plurality of phased output clock terminals comprises X phased output clock terminals; and
   the phase generator circuit comprises a plurality of delay chains having unit delays equal to the unit delays of the delay line, each delay chain comprising a series of N/X unit delays.

3. The DLL circuit of claim 2, wherein the phase generator circuit comprises (X−1) such delay chains.

4. The DLL circuit of claim 2, wherein X equals 4.

5. The DLL circuit of claim 1, further comprising:
   a clock network having an output terminal coupled to the feedback input terminal and an input terminal coupled to one of the plurality of phased output clock terminals.

6. The DLL circuit of claim 1, further comprising a trim decoder circuit having input terminals coupled to the output terminals of one of the first decoder circuit and the second decoder circuit, and further having output terminals coupled to the phase generator circuit.

7. A method of synchronizing a feedback clock signal from a clock network with an input clock signal, the method comprising:
   providing from the feedback clock signal in a first mode a plurality of first intermediate clock signals delayed from the feedback clock signal by incremental unit delays;
   storing, in the first mode and from the plurality of first intermediate clock signals, a first value representing a number of unit delays between a first edge of the feedback clock signal and the same edge of the input clock signal;
   storing, in the first mode and from the plurality of first intermediate clock signals, a second value representing a number of unit delays between the first edge of the feedback clock signal and the next same edge of the feedback clock signal;
   transitioning from the first mode to a second mode;
   providing from the input clock signal in the second mode a plurality of second intermediate clock signals delayed from the input clock signal by the incremental unit delays;

selecting, based on the first value, from among the second intermediate clock signals a selected clock signal, the selected clock signal being an intermediate clock signal subject to a selected delay about equal to an additional delay needed to bring the feedback clock signal into synchronization with the input clock signal;

providing the selected clock signal to the clock network; and providing, based on the second value and in the second mode, a plurality of phased clock signals from the selected clock signal.

8. The method of claim 7, wherein:

the second value comprises N unit delays; and providing the plurality of phased clock signals comprises providing x phased clock signals separated by N/X unit delays.

9. A delay-lock loop (DLL) circuit coupled to a clock network, the DLL circuit comprising:

means for receiving a feedback clock signal from the clock network;

means for receiving an input clock signal;

means for providing from the feedback clock signal in a first mode a plurality of first intermediate clock signals delayed from the feedback clock signal by incremental unit delays;

means for storing, in the first mode and from the plurality of first intermediate clock signals, a first value representing a number of unit delays between a first edge of the feedback clock signal and the same edge of the input clock signal;

means for storing, in the first mode and from the plurality of first intermediate clock signals a second value representing a number of unit delays between the a first edge of the feedback clock signal and the next same edge of the feedback clock signal;

means for transitioning from the first mode to a second mode;

means for providing from the input clock signal in the second mode a plurality of second intermediate clock signals delayed from the input clock signal by the incremental unit delays;

means for selecting, based on the first value, from among the second intermediate clock signals a selected clock signal, the selected clock signal being an intermediate clock signal subject to a selected delay about equal to an additional delay needed to bring the feedback clock signal into synchronization with the input clock signal;

means for providing the selected clock signal to the clock network; and means for providing, based on the second value and in the second mode, a plurality of phased clock signals from the selected clock signal.

10. An electronic system, comprising:

a clock network having an input terminal and an output terminal; and a delay-lock loop (DLL) circuit, the DLL circuit comprising:

a feedback input terminal coupled to the output terminal of the clock network;

an input clock terminal;

a plurality of phased output clock terminals, one of the plurality of phased output clock terminals being coupled to the input terminal of the clock network;

a delay line coupled to the feedback input terminal in a first mode and the input clock terminal in a second mode, the delay line having a plurality of output terminals;

a first latch circuit having input terminals coupled to the output terminals of the delay line and further having output terminals;

a first decoder circuit having input terminals coupled to the output terminals of the first latch circuit and further having output terminals;

a clock multiplexer circuit having data input terminals coupled to the output terminals of the delay line, select terminals coupled to the output terminals of the first decoder circuit, and an output terminal;

a second latch circuit having input terminals coupled to the output terminals of the delay line and further having output terminals;

a second decoder circuit having input terminals coupled to the output terminals of the second latch circuit and further having output terminals;

a phase generator circuit having a first input terminal coupled to the output terminal of the clock multiplexer circuit, control input terminals coupled to the output terminals of the second decoder circuit, and output terminals coupled to the plurality of phased output clock terminals; and a control circuit coupled to the first and second latch circuits, the delay line, and the clock multiplexer circuit.

11. The electronic system of claim 10, wherein:

the delay line comprises a series of N unit delays;

the plurality of phased output clock terminals comprises X phased output clock terminals; and the phase generator circuit comprises a plurality of delay chains having unit delays equal to the unit delays of the delay line, each delay chain comprising a series of N/X unit delays.

12. The electronic system of claim 11, wherein the phase generator circuit comprises (X−1) such delay chains.

13. The electronic system of claim 11, wherein X equals 4.

14. The electronic system of Claim 10, wherein the DLL circuit further comprises a trim decoder circuit having input terminals coupled to the output terminals of one of the first decoder circuit and the second decoder circuit, and further having output terminals coupled to the phase generator circuit.

* * * * *